(12) United States Patent
Otose

(10) Patent No.: US 10,074,326 B2
(45) Date of Patent: Sep. 11, 2018

(54) ELECTRONIC CIRCUIT, SCANNING CIRCUIT, DISPLAY DEVICE, AND ELECTRONIC CIRCUIT LIFE EXTENDING METHOD

(71) Applicant: NLT Technologies, Ltd., Kanagawa (JP)

(72) Inventor: Tomohiko Otose, Kanagawa (JP)

(73) Assignee: NLT TECHNOLOGIES, LTD., Kanagawa (JP)

( * ) Notice: Subject to any disclaimer, the term of this patent is extended or adjusted under 35 U.S.C. 154(b) by 167 days.

(21) Appl. No.: 15/058,685

(22) Filed: Mar. 2, 2016

(65) Prior Publication Data
US 2016/0260402 A1    Sep. 8, 2016

(30) Foreign Application Priority Data
Mar. 3, 2015    (JP) .................................. 2015-041517

(51) Int. Cl.
*G09G 3/36*    (2006.01)
*G11C 19/28*    (2006.01)

(52) U.S. Cl.
CPC ........... *G09G 3/3648* (2013.01); *G11C 19/28* (2013.01); *G11C 19/287* (2013.01); *G09G 3/3677* (2013.01); *G09G 3/3688* (2013.01); *G09G 2300/0417* (2013.01); *G09G 2300/0426* (2013.01); *G09G 2300/0828* (2013.01); *G09G 2310/0286* (2013.01); *G09G 2310/08* (2013.01); *G09G 2320/043* (2013.01)

(58) Field of Classification Search
CPC ......... G09G 3/3648; G09G 2300/0426; G09G 2300/0828; G09G 2310/0286; G11C 19/28; G11C 19/287
See application file for complete search history.

(56) References Cited

U.S. PATENT DOCUMENTS

| 5,222,082 A | 6/1993 | Plus | |
| 2006/0290390 A1* | 12/2006 | Jang | ........................ G11C 19/28 327/112 |
| 2008/0116944 A1* | 5/2008 | Tobita | .................... G11C 19/28 327/142 |

FOREIGN PATENT DOCUMENTS

| JP | 2008-262178 | 10/2008 |
| JP | 2010-534380 | 11/2010 |

* cited by examiner

*Primary Examiner* — Shaheda Abdin
(74) *Attorney, Agent, or Firm* — Young & Thompson

(57) ABSTRACT

To provide an electronic circuit and the like capable of extending the life greatly even when the transistors constituting the electronic circuit have property fluctuation. The electronic circuit includes switching-target circuits and a switching circuit for switching the switching-target circuits to an operating state from a stop state. The switching-target circuits include the switching-target circuit in an operating state and the switching-target circuit in an initial-to-stop state. Property fluctuation is generated in the transistors forming the switching-target circuits and the switching target due to an electric stress applied to the transistors. The switching circuit switches the switching-target circuit in the initial-to-stop state to an operating state by the transistor of the switching circuit.

17 Claims, 22 Drawing Sheets

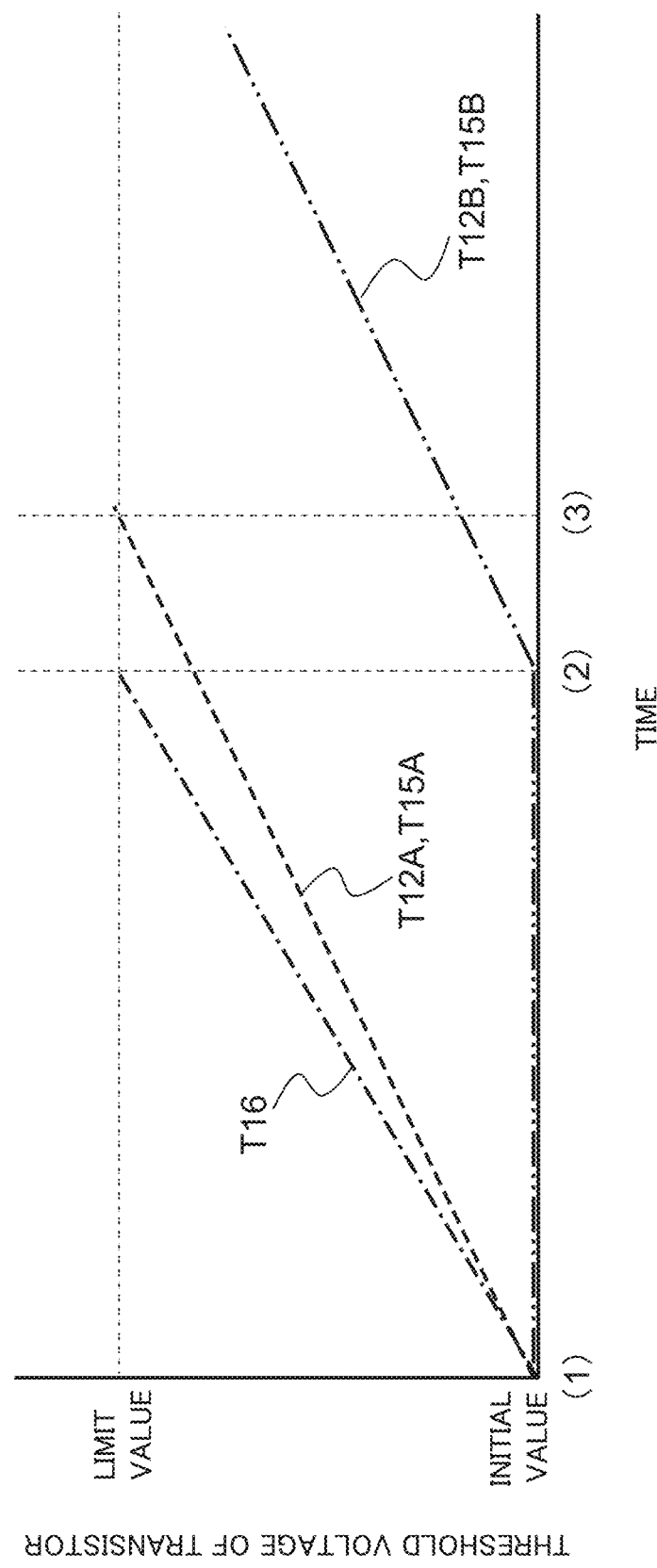

ELECTRONIC CIRCUIT, SCANNING CIRCUIT, DISPLAY DEVICE, AND ELECTRONIC CIRCUIT LIFE EXTENDING METHOD

CROSS-REFERENCE TO RELATED APPLICATION

This application is based upon and claims the benefit of priority from Japanese patent application No. 2015-041517, filed on Mar. 3, 2015, the disclosure of which is incorporated herein in its entirety by reference.

BACKGROUND OF THE INVENTION

1. Field of the Invention

The present invention relates to a technique for extending the life of electronic circuits. As an applied example thereof, the present invention relates to a scanning circuit of a display device and, more specifically, to a scanning circuit formed with a single conductive type thin film transistor.

2. Description of the Related Art

Display devices using amorphous silicon thin film transistors (referred to as "a-SiTFT (amorphous Silicon Thin Film Transistor)" hereinafter) are used broadly from small-sized panels of mobile apparatuses monitors and the like, to monitors for personal computers, large-sized panels of large-screen thin-type television sets and the like. In general, only the pixel array constituting the display area is formed with a-SiTFT, and an IC (Integrated Circuit) chip is used for the gate driving circuit for driving the pixels.

Recently, development of the techniques for forming the gate driving circuit simultaneously with the pixel array are being advanced in order to cut the manufacturing cost of the display and to decrease the frame length (distance from the external shape of the display to the display area). In the typical gate driving circuit formed with a-SiTFT, dynamic scanning circuits as disclosed in following Patent Documents are used.

The scanning circuit of U.S. Pat. No. 5,222,082 (FIG. 2, 37th row of second column to 27th row of third column: Patent Document 1) will be described by using FIG. 20 as Related Technique 1.

As shown in FIG. 20, the scanning circuit of Patent Document 1 is an example of the dynamic scanning circuit formed with single conductive type transistors 516 to 521, in which a plurality of stages 511 are connected in series.

When an input signal INPUT is turned to high level, the transistors 518 to 521 are both turned into an on-state. Thereby, a node P1 is set to VDD−Vth and a node P2 is set to VSS, respectively. Note that Vth is a threshold voltage of the transistor 518. Due to the potential increase of the node P1, the transistor 516 is turned into an on-state. Further, since the node P2 is turned to VSS, the transistor 517 and 519 come to be in an off-state.

Subsequently, when the input signal INPUT is turned to low level, the node P1 comes to be in a floating state. When a clock signal C1 is turned to high level from low level in that state, the potential of an output signal OUTPUT1 becomes increased. In that state, the potential of the node P1 in the floating state is also increased due to a bootstrap effect via the parasitic capacitance (not shown) between the node P1 of the transistor 516 and the node P3 (OUTPUT1). Thus, when the node P1 is increased to the potential higher than the high level, a high-voltage signal is applied to the gate of the transistor 516. Therefore, the high level of the clock signal C1 is transferred as the output signal OUTPUT1 without being attenuated.

Subsequently, when a clock signal C3 is turned to high level, the transistor 520 comes to be in an on state. Thus, the node P2 is set to VDD−Vth. Note here that Vth is the threshold voltage of the transistor 120. Thereby, the transistors 517 and 519 come to be in an on-state, so that the node P1 and P3 (OUTPUT1) are set to VSS, respectively. This makes it possible to prevent malfunctions of the circuit.

With the structure of Patent Document 1, the transistors 517, 519 are always in an on-state while the output signal OUTPUT1 is in low level and pull down the nodes P1, P3 (OUTPUT1) to VSS. That is, a high-level voltage is applied to the gates of the transistors 517, 519, while a low-level voltage is applied to the sources or the drains. This bias state is called hereinafter "plus gate stress". For example, when the circuit is formed with a-SiTFT, there is such an issue that the fluctuation of the threshold voltage becomes great due to the "plus gate stress".

Japanese Unexamined Patent Publication 2008-262178 (FIG. 3, paragraphs 0048 to 0058: Patent Document 2) and Japanese Unexamined Patent Publication 2010-534380 (FIG. 1, paragraphs 0034 to 0040: Patent Document 3) as Related Techniques 2, 3 disclose proposed solutions for such issue raised in Patent Document 1. The scanning circuit of Patent Document 2 will be described by referring to FIG. 21.

As shown in FIG. 21, Patent Document 2 employs a structure in which, out of two transistors 612, 613 of an output circuit 611 within a shift register 610, a voltage generating circuit 300 is connected to the gate of the transistor 612. The voltage generating circuit 600 is constituted with a judging circuit 601, an impedance converter 607, and a voltage setting circuit 620. Further, the voltage setting circuit 620 is constituted with a controller 602, an adder 603, a counter 604, and a DA converter circuit 606.

Further, the judging circuit 601 detects the operation state of the transistor 612, and the voltage setting circuit 620 controls the voltage to be supplied to the gate of the transistor 612 according to the detected result. That is, Patent Document 2 discloses that it is possible to increase the voltage to be applied to the gate of the transistor 612 according to the property fluctuation of the transistor 612 by providing the judging circuit 601 and the voltage setting circuit 620.

The scanning circuit of Patent Document 3 will be described by referring to FIG. 22.

As shown in FIG. 22, the scanning circuit of Patent Document 3 includes: a row pullup transistor 710; a bootstrap capacitor 711; a row pulldown transistor 712; a transistor 713 which charges the bootstrap capacitor 711; a transistor 714 which regenerates the state of the row pulldown transistor 712; a Vt detecting circuit 716; a positive voltage line 718; a negative voltage line 719; control lines 1 to N; and the like.

The Vt detecting circuit 716 detects the threshold voltage Vt of the row pulldown transistor 712, and supplies an output signal Vout that is acquired by adding or subtracting an offset value ΔV to/from an input signal Vin to the gate of the row pulldown transistor 712.

However, when the circuit structures disclosed in Patent Documents 2 and 3 are applied to a scanning circuit constituted with a single conductive type thin film transistor, a following issue is raised.

The scanning circuits of Patent Documents 2, 3 are designed to compensate the current driving capacity of the transistor by increasing the voltage to be applied to the gate according to the detected threshold voltage of the transistor.

According to the experiments done by the inventors, et al. of the present invention, it is verified that the fluctuation in the threshold voltage of the transistor becomes greater as the absolute value of the voltage to be applied to the gate becomes higher. This is considered because the electric stress imposed upon the transistor becomes also greater as the absolute value of the voltage to be applied to the gate becomes higher.

Because of that, with the structures of Patent Documents 2, 3, the electric stress imposed upon the transistor becomes larger than that of before the detection because the voltage to be applied to the gate is increased during the action of the circuit. Thus, more fluctuation in the threshold voltage is generated. Therefore, there is such an issue with the structures of Patent Documents 2 and 3 that the circuit life of the scanning circuit cannot be extended sufficiently.

It is therefore an exemplary object of the present invention to provide an electronic circuit and the like capable of extending the life greatly even when there is fluctuation in the property of the transistor that forms the electronic circuit.

SUMMARY OF THE INVENTION

The electronic circuit according to an exemplary aspect of the invention is an electronic circuit formed with a plurality of transistors, including: two or more switching-target circuits and one or more switching circuit which switches the switching-target circuits to an operating state from a stop state, wherein: the two or more switching-target circuits include the switching-target circuit in the operating state and the switching-target circuit in the initial-to-stop state; the transistors forming the switching-target circuits and the switching circuits have property fluctuation generated by an electric stress applied to the transistors; and the switching circuit switches the switching-target circuit in the initial-to-stop state to the operating state by the property fluctuation of the transistors of the switching circuit.

The electronic circuit life extending method according to another exemplary aspect of the invention is a life extending method used for an electronic circuit which is formed with a plurality of transistors and includes two or more switching-target circuits and one or more switching circuit which switches the switching-target circuits to an operating state from a stop state, wherein: the two or more switching-target circuits include the switching-target circuit in the operating state and the switching-target circuit in the initial-to-stop state; the transistors forming the switching-target circuits and the switching circuit have property fluctuation generated by an electric stress applied to the transistors, the method including: switching the switching-target circuit in the initial-to-stop state to the operating state by the property fluctuation of the transistors of the switching circuit.

When the switching-target circuit in an operating state comes to be in a stop state due to the property fluctuation of the transistor, the present invention is designed to switch the switching-target circuit in an initial-to-stop state to the operating state by the property fluctuation of the transistors of the switching circuit. Therefore, as an exemplary advantage according to the invention, it is possible to extend the life of the electronic circuit greatly even when the property fluctuation occurs in the transistor that forms the electronic circuit.

BRIEF DESCRIPTION OF THE DRAWINGS

FIG. 6 is a timing chart showing changes generated over the time in the threshold voltage of the transistor that forms the unit circuit according to the first exemplary embodiment;

DETAILED DESCRIPTION OF THE PREFERRED EMBODIMENTS

Figure 1:
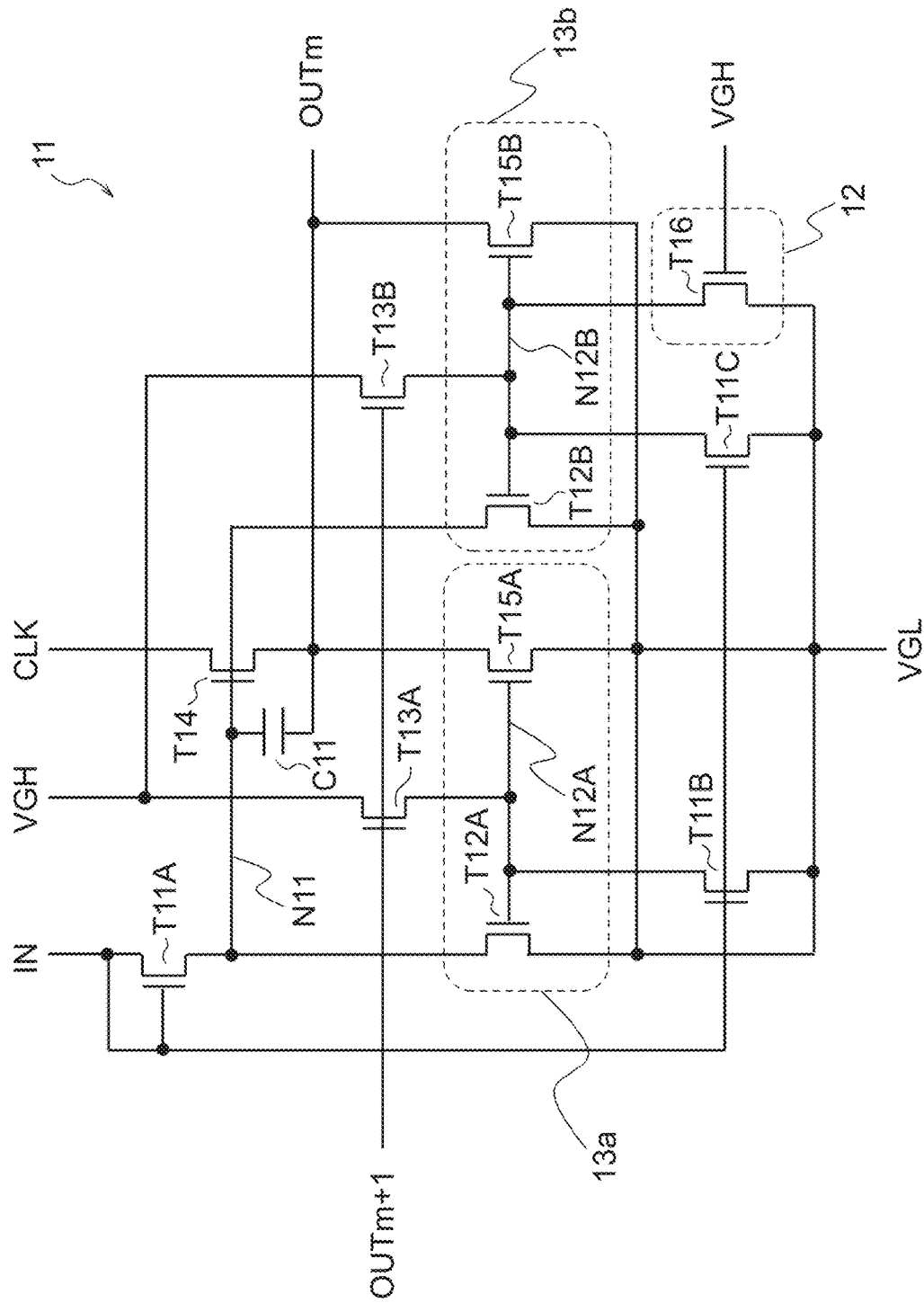
FIG. 1 is a circuit diagram showing the structure of a unit circuit according to a first exemplary embodiment.

Modes (referred to as "exemplary embodiments" hereinafter) for embodying the present invention will be described hereinafter while referring to the accompanying drawings. In the current Specification and Drawings, same reference numerals are used for substantially the same structural elements. Note, however, that the reference numerals of the following exemplary embodiments are irrelevant to the reference numerals of the related techniques described above.

As shown in FIG. 1, an electronic circuit (11) according to the present invention is an electronic circuit formed with a plurality of transistors (T12A, - - -) and includes: two or more switching-target circuits (13a, 13b) and one or more switching circuit (12) which switches those switching-target circuits (13a, 13b) from a stop state to an operating state. The two or more switching-target circuits (13a, 13b) include the switching-target circuit (13a) in an operating state and the switching-target circuit (13b) that is in an initial-to-stop state. The transistors (T12A, - - -) forming the switching-target circuits (13a, 13b) and the switching circuit (12) have property fluctuation generated due to an electric stress applied to the transistors (T12A, - - -). The switching circuit (12) switches the switching-target circuit (13b) in the initial-to-stop state to an operating state by the property fluctuation of the transistor (T16) of the switching circuit (12).

The present invention is structured to switch the switching-target circuit (13b) in the initial-to-stop state into an operating state by the property fluctuation of the transistor (T16) of the switching circuit (12) in a case where the switching-target circuit (13a) in the operating state comes to be in a stop state because of the property fluctuation of the transistors (T12A, - - -), so that it is possible to extend the life of the electronic circuit (11) greatly even when the property fluctuation occurs in the transistors (T12A, - - -) that form the electronic circuit (11).

For example, the transistor (T16) of the switching circuit (12) applies an off-voltage to the gates of the transistors (T12B, - - -) of the switching-target circuit (13b) in the initial-to-stop state to maintain the switching-target circuit (13b) to be in the initial-to-stop state, and stops application of the off-voltage to the transistors (T12B, - - -) to switch the switching-target circuit (13b) to an operating state by the property fluctuation of the transistor (T16).

In this case, the transistor (T16) of the switching circuit (12) may stop application of the off-voltage to the transistors (T12B, - - -) before the switching-target circuit (12a) in the operating state comes to be in a stop state because an electric stress is applied more and the property fluctuation proceeds faster compared to the case of the transistors (T12A, - - -) of the switching-target circuit in the operating state.

For example, the above-described electric stress is the applied voltage and the applied time for the gates of the transistors (T12A, - - -), and the above-described property fluctuation is the shift in the threshold voltage.

An electric circuit life extending method according to the present invention is the actions of the electronic circuit (11) according to the present invention taken as the invention of a method.

First Exemplary Embodiment

Figure 2:
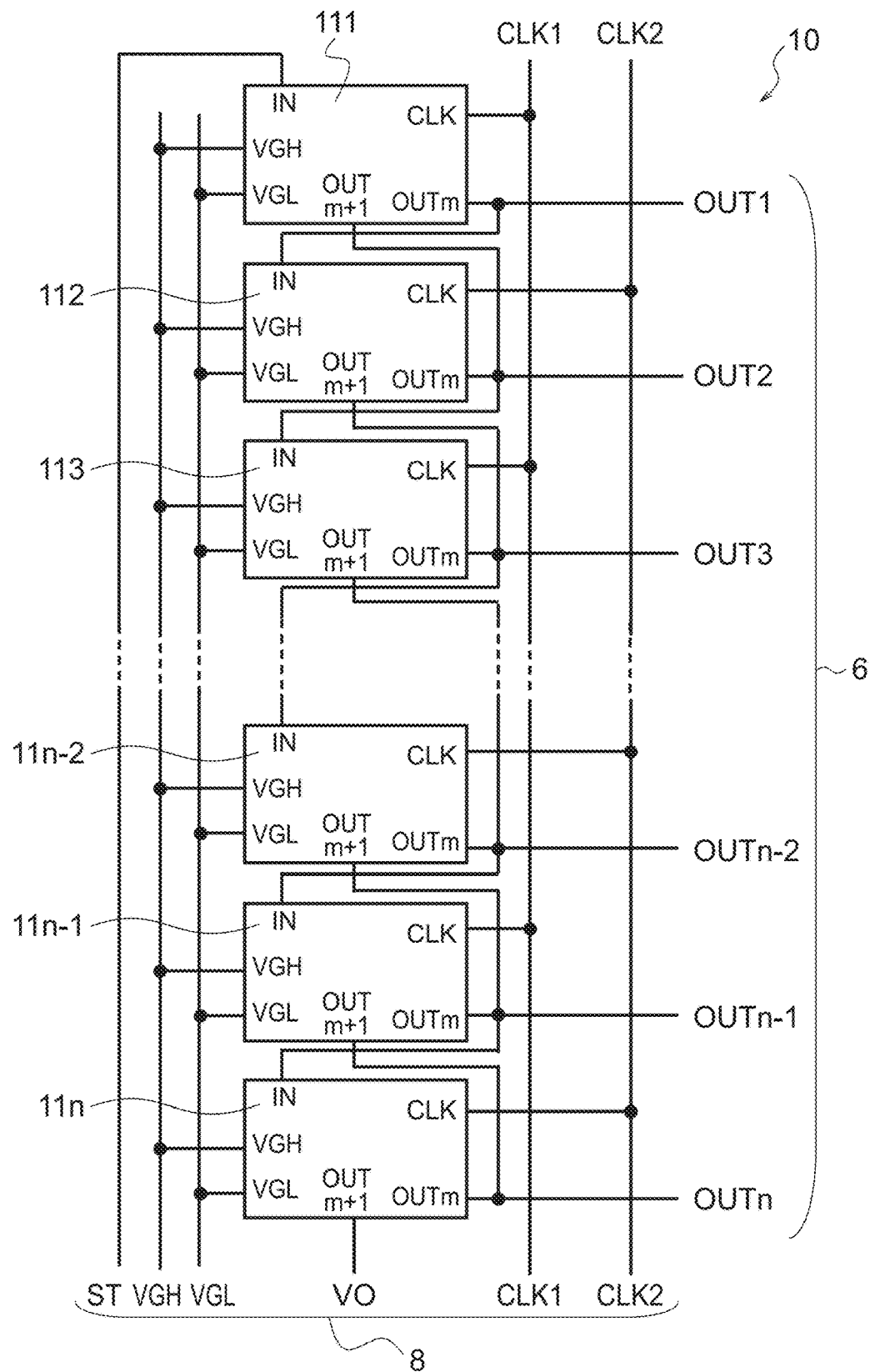
FIG. 2 is a block diagram showing the structure of a scanning circuit according to the first exemplary embodiment.

Hereinafter, a scanning circuit 10 (FIG. 2) including a plurality of unit circuits 11 (FIG. 1) each constituted with an electronic circuit according to the present invention will be described as a first exemplary embodiment of the present invention. An arbitrary unit circuit out of unit circuits 111 to 111n shown in FIG. 2 is shown as the unit circuit 11 in FIG. 1. As shown in FIG. 1 and FIG. 2, the plurality of unit circuits 11 are controlled by synchronizing with a clock signal. The plurality of transistors described above are a plurality of single conductive type thin film transistors T12A, - - - -. The two or more switching-target circuits described above are two or more potential setting circuits (13a, 13b) which set the nodes within the unit circuits 11 to a specific potential, which include the potential setting circuit (13a) in an operating state and the potential setting circuit (13b) in an initial-to-stop state.

For example, the thin-film transistor T16 of the switching circuit 12 applies an off-voltage to the gates of the transistors T12B, T15B of the potential setting circuit (13b) in the initial-to-stop state to maintain the potential setting circuit (13b) to be in the initial-to-stop state through, and stops application of the off-voltage to the transistors T12B, T15B by the property fluctuation of thin-film transistor T16 to switch the potential setting circuit (13b) to the operating state.

In this case, the property fluctuation of the thin-film transistor T16 of the switching circuit 12 stops application of the off-voltage to the thin-film transistors T12B, T15B before the potential setting circuit (13a) in an operating state comes to be in a stop state because an electric stress is applied more and the property fluctuation proceeds faster compared to the case of the thin film transistors T12A, T15A of the potential setting circuit (13a) in the operating state.

More specifically, the two or more potential setting circuits are constituted with the first potential setting circuit (13a) in an operating state and the second potential setting circuit (13b) in an initial-to-stop state. The thin-film transistor T16 of the switching circuit 12 applies an off-voltage to the gates of the thin-film transistors T12B, T15B of the second potential setting circuit (13b) to maintain the second potential setting circuit (13b) to be in the initial-to-stop state, and stops application of the off-voltage to the thin-film transistors T12B, T15B by the property fluctuation of the thin-film transistor T16 before the first potential setting circuit (13a) comes to be in a stop state from the operating state because the electric stress is applied more and the property fluctuation proceeds faster compared to the case of the thin-film transistors T12A, T15A of the first potential setting circuit (13a) to switch the second potential setting circuit (13b) to the operating state.

In other words, the unit circuit 11 corresponds to a case of N=2 in the following description. N is defined as an integer of 2 or larger, and k is defined as an integer from 1 to N−1. The above-described two or more potential setting circuits are constituted with the first to the N-th potential setting circuits (13a, 13b). The k-th potential setting circuit (13a) is in an operating state, the (k+1)-th to the N-th potential setting circuits (13b) are in an initial-to-stop state, and the above-described one or more switching circuit is constituted with the first to the (N−1)-th switching circuits 12. The thin-film transistor T16 of the k-th switching circuit 12 applies an off-voltage to the gates of the thin-film transistors T12B, T15B of the (k+1)-th potential setting circuit (13b) to maintain the (k+1)-th potential setting circuit (13b) to be in an initial-to-stop state and stops application of the off-voltage to the transistors T12B, T15B by the property fluctuation of the thin-film transistor T16 before the k-th potential setting circuit (13a) comes to be in a stop state from the operating state because the electric stress is applied more and the property fluctuation proceeds faster compared to the case of the thin-film transistors T12A, T15A of the k-th potential setting circuit (13a) to switch the (k+1)-th potential setting circuit (13b) to an operating state. Note here that a second exemplary embodiment to be described later corresponds to a case of N=1, and a third exemplary embodiment corresponds to a case of N=3.

More specifically, the above-described electric stress is the applied voltage and the applied time for the gates of the thin-film transistors T12A, - - - -, and the above-described property fluctuation is the shift in the threshold voltage. The above-described single conductive type is a N-channel type, and the above-described first potential setting circuit and the second potential setting circuit are the first pulldown circuit 13a and the second pulldown circuit 13b for setting the node to a low potential.

(Explanations of Structures)

Next, the structures of the first exemplary embodiment will be described in more details. Hereinafter, the "thin-film transistor" is simply referred to as a "transistor".

Figure 7A:
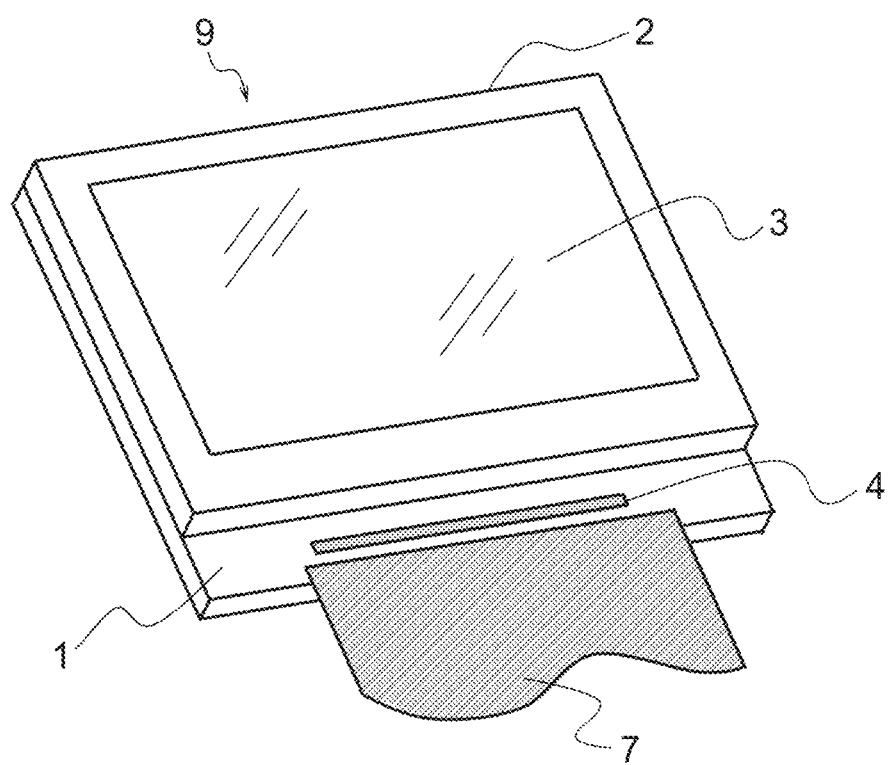
FIG. 7A is a perspective view showing the structure of a display device according to the first exemplary embodiment.
Figure 7B:
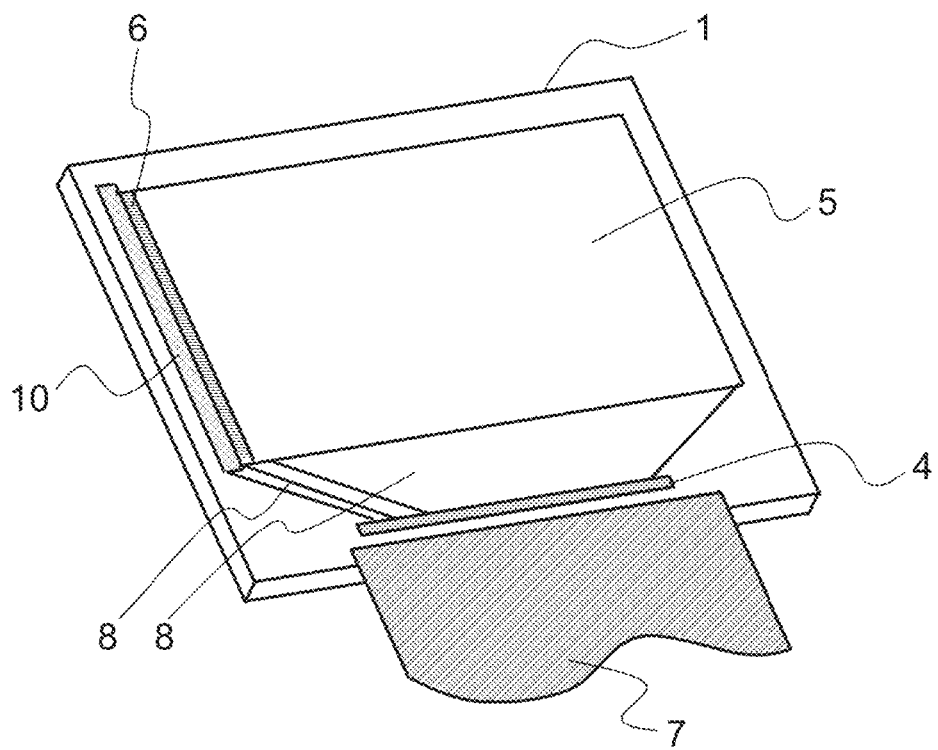
FIG. 7B is a perspective view showing the structure of a first substrate in FIG. 7A.

As shown in FIG. 7A, a display device 9 according to the first exemplary embodiment is mostly constituted with a first substrate 1, a second substrate 2, a display unit 3, a driving circuit 4, and a connection cable 7. Further, as shown in FIG. 7B, the first substrate 1 is mostly constituted with the driving circuit 4, a pixel array 5, a scanning circuit 10, and a scanning line 6. Signals outputted from an externally connected apparatus, not shown, are supplied to the driving circuit 4 via the connection cable 7. Further, signals outputted from the driving circuit 4 are supplied to the scanning circuit 10 and the pixel array 5 via a control signal line 8. Output signals of the scanning circuit 10 are outputted to the pixel array 5 via the scanning line 6. The pixel array 5 controls each pixel upon receiving the signals outputted from the driving circuit 4 and the scanning circuit 10, respectively. This control makes it possible to display intended videos on the display unit 3 shown in FIG. 7A. Examples of the display device 9 may be a liquid crystal display, an organic EL display, and the like.

As shown in FIG. 2, in the scanning circuit 10 of the first exemplary embodiment, a plurality of unit circuits 111 to 11n are provided, and the unit circuits 111 to 11n and the scanning line 6 (output signals OUT1 to OUTn) are connected. Note here that "n" is a natural number, and it is a value determined according to the number of pixels in the longitudinal direction of the pixel array 5 (FIG. 7B). Note that "m" to be described later is an arbitrary integer from 1 to n.

In the scanning circuit 10, the unit circuits 111 to 11n are controlled by the control signals inputted via the control signal line 8, and the output signals OUT1 to OUTn are supplied to the scanning line 6 from each of the unit circuits 111 to 11n. The control signals inputted to the scanning circuit 10 are constituted with a start signal ST, a higher power supply voltage VGH, a lower power supply voltage VGL, a final stage control signal VO, and clock signals CLK1, CLK2. Hereinafter, the higher power supply voltage VGH and the lower power supply voltage VGL are simply referred to as "VGH" and "VGL".

The unit circuit 11m includes a plurality of input terminals IN, VGH, VGL, CLK, OUTm+1, and an output terminal OUTm. A start signal ST is supplied to the input terminal IN of the unit circuit 111 of the first stage. To the input terminals IN of the unit circuit 112 of the second stage and thereafter, signals of the output terminals OUTm of the previous stages are supplied.

Further, either the clock signal CLK1 or the clock signal CLK2 is supplied to the input terminal CLK. For example, the clock signal CLK1 is supplied to the input terminal CLK of the unit circuit 111, and the clock signal CLK2 is supplied to the input terminal CLK of the unit circuit 112. Regarding the input terminals CLK of the unit circuit 113 and thereafter, the connection relations of the unit circuits 111, 112 and the clock signals CLK1, CLK2 are repeated.

The signal of the output terminal OUTm is supplied to the scanning line 6 and also supplied to the input terminal OUTm+1 of the unit circuit 11m−1 of the previous stage and the input terminal IN of the unit circuit 11m+1 of the latter stage, respectively. The final stage control signal VO is supplied to the input terminal OUTm+1 of the unit circuit 11n of the final stage.

As shown in FIG. 1, the unit circuit 11 of the first exemplary embodiment is constituted with a plurality of transistors T11A to T16, a capacitor C11, and wirings as well as terminals to be described later. Those terminals are the input terminals IN, CLK, OUTm+1, VGH, VGL, and the output terminal OUTm.

The first pulldown circuit 13a is constituted with the transistors T12A, T15A, which is controlled by the potential of the node N12A and has a function of setting the node N11 and the output terminal OUTm to VGL. The second pulldown circuit 13b is constituted with the transistors T12B, T15B, which is controlled by the potential of the node N12B and has a function of setting the node N11 and the output terminal OUTm to VGL. The switching circuit 12 is constituted with the transistor T16, and has a function of setting the node N12B to VGL.

The node N11 shows the wiring connected to the source of the transistor T11A, the drain of the transistor T12A, the drain of the transistor T12B, and the gate of the transistor T14. Further, the node N12A shows the wiring connected to the drain of the transistor T11B, the gate of the transistor T12, the gate of the transistor T15A, and the source of the transistor T13A. Further, the node N12B shows the wiring connected to the gate of the transistor T12B, the gate of the transistor T15B, the source of the transistor T13B, the drain of the transistor T11C, and the drain of the transistor T16.

The transistor T11A is gate-controlled by the potential of the input terminal IN, and has a function of increasing the potential of the node N11. The transistor T11B is gate-controlled by the potential of the input terminal IN, and has a function of setting the node N12A to VGL. The transistor T12A (T12B) is gate-controlled by the potential of the node N12A (N12B), and has a function of setting the node N11 to VGL. The transistor T13A (T13B) is gate-controlled by the potential of the input terminal OUTm+1, and has a function of increasing the potential of the node N12A (N12B). The transistor T14 is gate-controlled by the potential of the node N11, and has a function of supplying the potential of the input terminal CLK to the output terminal OUTm or electrically isolating the input terminal CLK and the output terminal OUTm. The transistor T15A (T15B) is gate-controlled by the potential of the node N12A (N12B), and has a function of setting the output terminal OUTm to VGL. The transistor T16 has its gate connected to VGH, the source connected to VGL, and the drain connected to the node N12B, and has a function of setting the node N12B to VGL. The capacitor C11 has one of the electrodes connected to the node N11, the other electrode connected to the output terminal OUTm, and has a function of accumulating the electric charges so that the potential of the node N11 does not fluctuate due to leak current of the transistors T11A, T12A, T12B, noise mixed from outside, etc.

Note here that it is desirable to design the physical shapes and the sizes of each transistor and the capacitor so that the circuit can operate with a sufficient margin. Regarding the combination of the transistors T13B and T16, it is desirable to design those in such a manner that the driving capacity of the transistor T16 becomes higher than that of the transistor T13B since, as will be described later, the both transistors are in an on-state and operate with a through-current flown therethrough. Similarly, it is desirable to design the transistors in such a manner that the driving capacity of the transistor T11A becomes higher than that of the transistor T12A (T12B).

Figure 3:
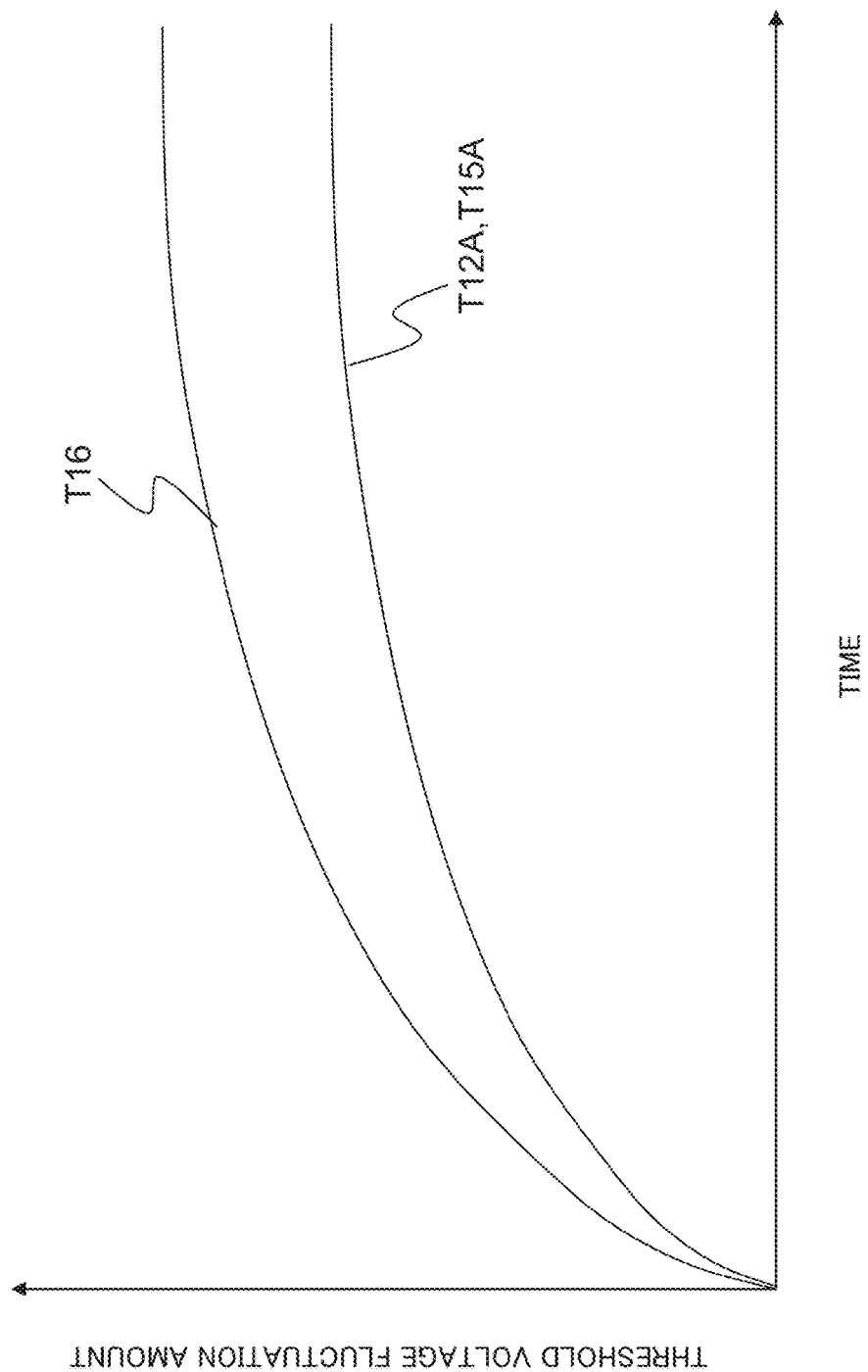
FIG. 3 is a graph showing the property fluctuation of a transistor that forms the unit circuit according to the first exemplary embodiment.

Further, the threshold voltage of the transistors T12A, T15A, and T16 are fluctuated because "plus gate stress" is applied thereto during the circuit operation. As will be described later, VGH–Vth is applied to the gates of the transistors T12A and T15A provided that the threshold voltage of the transistor T13A is Vth. In the meantime, VGH is applied to the gate of the transistor T16. That is, the "plus gate stress" applied to the transistor T16 is larger than the "plus gate stress" applied to the transistors T12A, T15A. Thus, as shown in FIG. 3, the shift amount of the threshold voltage over the time becomes larger in the transistor T16 than in the transistors T12A, T15A.

The scanning circuit 10 that drives the display device 9 in the first exemplary embodiment includes, in the unit circuit 11 as a structural element thereof: a plurality of transistors (the first and second pulldown circuits 13a, 13b) which maintain the node N11 and the output terminal OUTm to VGL and set those not to be in a floating state; and the switching circuit 12 which switches the second pulldown circuit 13b to an operating state from a stop state.

During the operation of the first pulldown circuit 13a, "plus gate stress" is applied to the transistors T12A, T15A, and T16, so that the threshold voltage is fluctuated over the time. However, the shift amount of the threshold voltage is larger in the transistor T16 than in the transistors T12A and T15A. Thus, before the transistors T12A, T15A come to be in a stop state, the transistor T16 is turned to be in a stop state. Therefore, it becomes difficult to maintain the transistors T12B, T15B to be in a stop state, so that the transistors T12B, T15B are changed over to an operating state. That is, the second pulldown circuit 13b is changed over to an operating state from a stop state. Thereby, the capacity for setting the node N11 and the output terminal OUTm to the lower power supply voltage VGL can be maintained.

By employing such structures, the circuit life of the scanning circuit 10 can be extended. Further, it becomes unnecessary to have a means for detecting the operation state of the transistors T12A, T15A and also unnecessary to have a special control signal for releasing the stop state of the transistors T12B, T15B. Therefore, there is no increase in the circuit scale and in the cost for the external control module.

(Explanations of Actions)

Next, actions of the scanning circuit 10 according to the first exemplary embodiment will be described.

Figure 4:
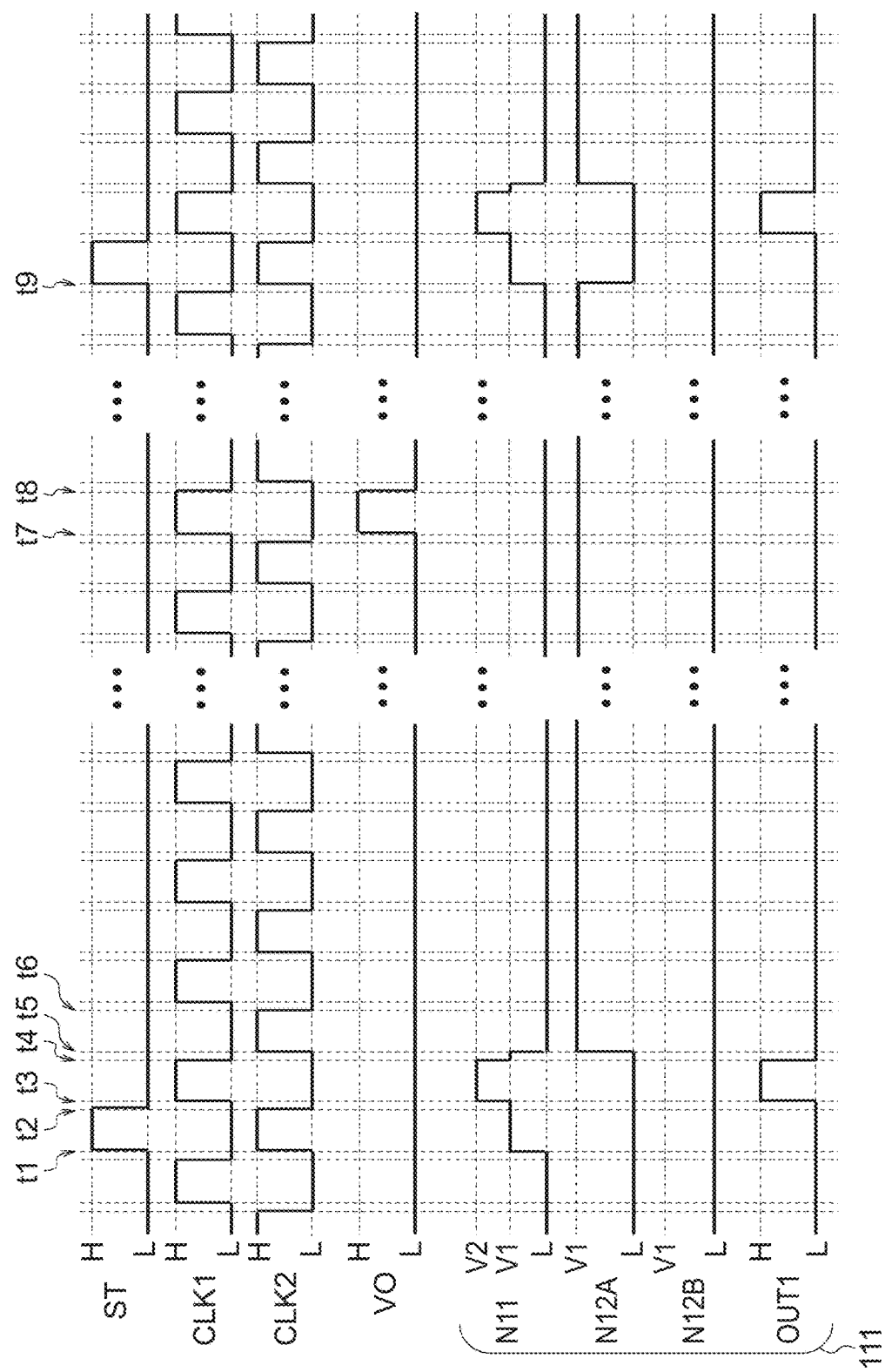
FIG. 4 is a first timing chart showing actions of the scanning circuit according to the first exemplary embodiment.
Figure 5:
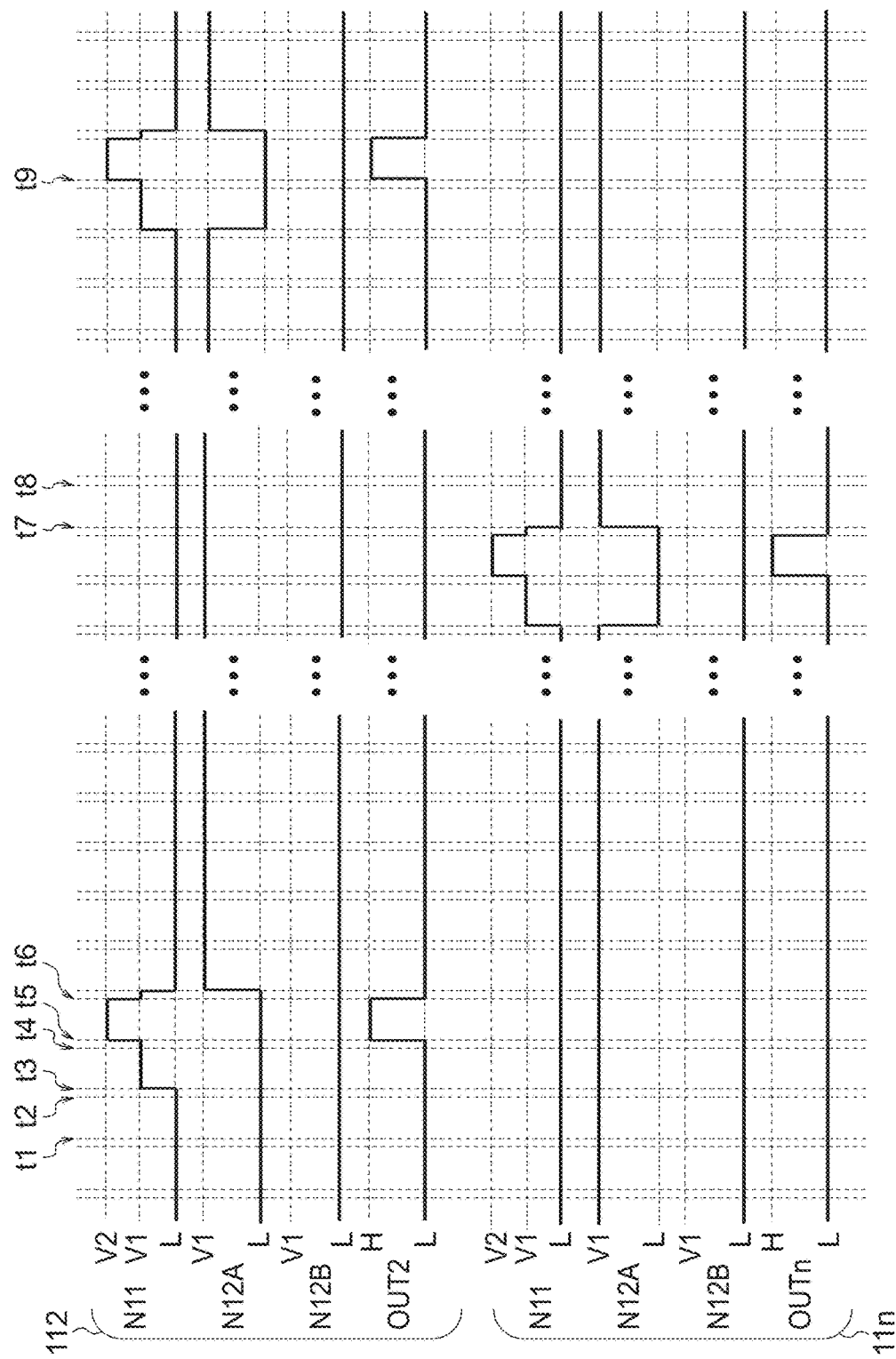
FIG. 5 is a second timing chart showing actions of the scanning circuit according to the first exemplary embodiment.

The actions of the scanning circuit 10 and the unit circuit 11 will be described by adding the drawings from FIG. 4 to FIG. 6 to the drawings from FIG. 1 to FIG. 3. In FIG. 4 and FIG. 5, the lateral axis shows the time and the longitudinal axis shows the potentials of each terminal. L and H in the longitudinal axis are abbreviations of VGL and VGH, respectively. The longitudinal axis in FIG. 4 shows the potentials of each terminal of the control signal line 8 and the unit circuit 11, and the longitudinal axis in FIG. 5 shows the potentials of each terminal of the unit circuits 112, 11n. Further, in FIG. 6, the lateral axis shows the time and the longitudinal axis shows the fluctuation amount of the threshold voltage in each transistor.

Period (t1 to t2)

The start signal ST is changed to VGH from VGL. The clock signal CLK1 is VGL. Further, the clock signal CLK2 is changed to VGH from VGL.

Actions of Unit Circuit 111: Since the transistor T11A is turned to an on-state, the node N11 is increased from VGL to V1 (=VGH–VGL–Vth) provided that the threshold voltage of the transistor T11A is Vth. Thereby, the transistor T14 comes to be in an on-state. The clock signal CLK1 connected to the input terminal CLK is VGL, so that the output signal OUT1 is set to VGL. Further, the transistor T11B comes to be in an on-state, so that the node N12A is set to VGL. Thus, the transistors T12A and T15A are in an off-state. The node N12B is VGL since the transistor T16 is in an on-state. Thereby, the transistors T12B and T15B are in an off-state.

Actions of Unit Circuits 112 to 11n: The node N11, N12A, and N12B are all VGL, so that the output signals OUT2 to OUTn are all VGL.

Period (t3 to t4)

The start signal ST is changed to VGL. The clock signal CLK1 is changed to VGH from VGL, and the clock signal CLK2 is VGL.

Actions of Unit Circuit 111: The transistors T11A and T11B are turned to an off-state. Thereby, the nodes N11 and N12A come to be in a floating state. The clock signal CLK1 is turned to VGH, so that it passes through the transistor T14 in an on-state and the potential of the output signal OUT1 is increased from VGL. Since the potential of the output signal OUT1 as one of the electrodes of the capacitor C11 is increased, the potential of the other electrode (node N11) of the capacitor C11 in a floating state is increased further to V2 (=2 (VGH–VGL)–Vth) due to a bootstrap effect provided that the threshold voltage of the transistor T11A is Vth. Thus, a voltage of VGH or higher is applied to the gate of the transistor T14, so that the potential of the output signal OUT1 is changed up to VGH without being attenuated.

Actions of Unit Circuit 112: As in the actions of the unit circuit 111 in the period (t1 to t2), the transistors T11A, T11B, and T14 come to be in an on-state.

Actions of Unit Circuits 113 to 11n: The node N11, N12A, and N12B are all VGL, so that the output signals OUT3 to OUTn are all VGL.

Period (t5 to t6)

The clock signal CLK1 is VGL. The clock signal CLK2 is changed to VGH from VGL.

Actions of Unit Circuit 111: The output signal OUT2 is changed to VGH due to the action of the unit circuit 112 to be described later, so that VGH is supplied to the input terminal OUTm+1 of the unit circuit 111. Thus, the transistors T13A and T13B both come to be in an on-state. Since the transistor T13A comes to be in an on-state, the node N12A is changed to V1 (=VGH–VGL–Vth) from VGL provided that the threshold voltage of the transistor T13A is Vth. Thereby, the transistors T12A and T15A both come to be in an on-state, and the node N11 and the output terminal OUTm are changed to VGL. In the meantime, since the driving capacity of the transistor T16 is set to be higher than the driving capacity of the transistor T13B, the node N12B is maintained to VGL. Therefore, the transistors T12B and T15B are maintained to be in an off-state.

Actions of Unit Circuit 112: As in the actions of the unit circuit 111 in the period (t3 to t4), the potential of the output signal OUT2 is changed up to VGH by the transistor T14.

Actions of Unit Circuit 113: The actions are same as those of the unit circuit 111 in the period (t1 to t2).

Actions of Unit Circuits 114 to 11n: The nodes N11, N12A, and N12B are all VGL, so that the output signals OUT4 to OUTn are all VGL.

After the time t6, the actions of the unit circuits 114 to 11n are the same as the actions of the unit circuit 111 in the period (t1 to t6). With such actions, OUT4 to OUTn are sequentially changed to VGH.

Period (t7 to t8)

The final-stage control signal VO is changed to VGH from VGL.

Actions of Unit Circuit 11n: Since the potential of the input terminal OUTm+1 is turned to VGH, the transistors T13A and T13B come to be in an on-state. As in the actions of the unit circuit 111 in the period (t5-t6), the node N11 and the output terminal OUTm are changed over to VGL.

After the time t8, the actions same as those after the time t1 are repeated at the timing (time t9) where the start signal ST is changed to VGH from VGL again.

Next, transitions of the threshold voltages over the time regarding each of the transistors constituting the first and second pulldown circuits 13a, 13b and the switching circuit 12 within the unit circuit 11 will be described by referring to FIG. 6. As has been described earlier, the transistor T16 corresponds to the switching circuit 12, the transistors T12, T15 correspond to the first pulldown circuit 13a, and the transistors T12B, T15B correspond to the second pulldown circuit 13b, respectively.

Time (1): The threshold voltages of each of the transistors are in a state of the initial value and are all equivalent. After starting the operation, the "plus gate stress" is applied to the transistors T12A, T15A, and T16 as described in the actions of the unit circuit 11. Thereby, the threshold voltages of the transistors T12A, T15A, and T16 are increased. At that time, the amount of the "plus gate stress" applied to the transistor T16 is larger than that applied to the transistors T12A, T15A, so that the threshold voltage thereof is fluctuated more. In the meantime, the transistors T12B and T15B are both in an off-state because of the actions of the transistor T16. Thus, the "plus gate stress" is not applied, so that the threshold voltage is remained as the initial value.

Time (2): Because the threshold voltage becomes high, the transistor T16 does not come to be in a sufficient on-state. Thus, the transistors T12B and T15B cannot be maintained in an off-state. The threshold voltage of such state is defined as "limit value". Thereafter, the potential of the node N12B is increased by the transistor T13B that is turned to be in an on-state, so that the transistors T12B and T15B both come to be in an on-state. Thus, after the time (2), the "plus gate stress" is applied also to the transistors T12B and T15B. Thereby, the threshold voltages of the transistors T12B and T15B are increased.

Time (3): The threshold voltages of the transistors T12A, T15A reach the limit value, so that the node N11 and the output terminal OUTm cannot be maintained to VGL in the transistors T12A, T15A. In the meantime, the capacity for maintaining the node N11 and the output terminal OUTm to VGL in the transistors T12B, T15B is remained so that the node N11 and the output terminal OUTm can be maintained to VGL securely.

As described above, the scanning circuit 10 which drives the display device 9 according to the first exemplary embodiment includes the unit circuit 11 that is the structural element thereof. In the unit circuit 11, a plurality of transistors (the first and second pulldown circuits 13a, 13b) for maintaining the node N11 and the output terminal OUTm to VGL and setting those not to be in a floating state are provided and also the switching circuit 12 for switching the transistors T12B, T15B to an operating state form an operation-stop state is provided.

Further, at the start of the operation, the transistors T12A and T15A function to maintain the node N11 and the output terminal OUTm to VGL. In the meantime, the transistors T12B and T15B are turned to be in an off-state by the transistor T16. During the operation, the "plus gate stress" is applied to the transistors T12A, T15A, and T16, so that the threshold voltages thereof become increased over the time. Note here that threshold voltage of the transistor T16 becomes increased first since the "plus gate stress" to be applied is larger than that applied to the transistors T12A and T15A. As a result, it becomes difficult for the transistor T16 to maintain the transistors T12B and T15B to be in an operation stop state, so that the transistor T12B and T15B are switched to an operating state from the operation stop state.

Thereafter, even when the transistors T12A and T15A become unable to set the node N11 and the output terminal OUTm to VGL, the node N11 and the output terminal OUTm can be set to VGL by the transistors T12B and T15B. Therefore, the circuit life of the scanning circuit 11 can be extended.

Second Exemplary Embodiment (Explanations of Structures)

A second exemplary embodiment is different from the first exemplary embodiment in terms of the structures of the scanning circuit and the unit circuit. An arbitrary unit circuit out of unit circuits 211 to 21n in FIG. 9 is shown as a unit circuit 21 in FIG. 8. Further, the structure of the display device of the first exemplary embodiment shown in FIG. 7A and the structure of the first substrate shown in FIG. 7B are also applied to the second exemplary embodiment.

As shown in FIG. 9, in the scanning circuit 20 of the second exemplary embodiment, a plurality of unit circuits 211 to 21n are provided, and the unit circuits 211 to 21n and the scanning line 6 (outputs signals OUT1 to OUTn) are connected. Note here that "n" is a natural number, and it is a value determined according to the number of pixels in the longitudinal direction of the pixel array 5 (FIG. 7B). Note that "m" to be described later is an arbitrary integer from 1 to n.

In the scanning circuit 20, the unit circuits 211 to 21n are controlled by the control signals inputted via the control signal line 8, and the output signals OUT1 to OUTn are supplied to the scanning line 6 from each of the unit circuits 211 to 21n. The control signals inputted to the scanning circuit 20 are constituted with a start signal ST, VGH, VGL, a final stage control signal VO, and clock signals CLK1, CLK2.

The unit circuit 21m includes a plurality of input terminals IN, VGH, VGL, CLKa, CLKb, OUTm+1, and an output terminal OUTm. A start signal ST is supplied to the input terminal IN of the unit circuit 211 of the first stage. To the input terminals IN of the unit circuit 212 of the second stage and thereafter, signals of the output terminals OUTm of the previous stages are supplied.

Further, either the clock signal CLK1 or the clock signal CLK2 is supplied to the input terminals CLKa and CLKb. For example, in the unit circuit 211, the clock signal CLK1 is supplied to the input terminal CLKa, and the clock signal CLK2 is supplied to the input terminal CLKb, respectively. Inversely, in the unit circuit 212, the clock signal CLK2 is supplied to the input terminal CLKa, and the clock signal CLK1 is supplied to the input terminal CLKb. Regarding the unit circuit 213 and thereafter, the connection relations of the unit circuits 211, 212 and the clock signals CLK1, CLK2 are repeated.

The output terminal OUTm is connected to the scanning line 6 and also connected to the input terminal OUTm+1 of the unit circuit 21m−1 of the previous stage and the input terminal IN of the unit circuit 21m+1 of the latter stage, respectively. The final stage control signal VO is supplied to the input terminal OUTm+1 of the unit circuit 21n of the final stage.

Figure 8:
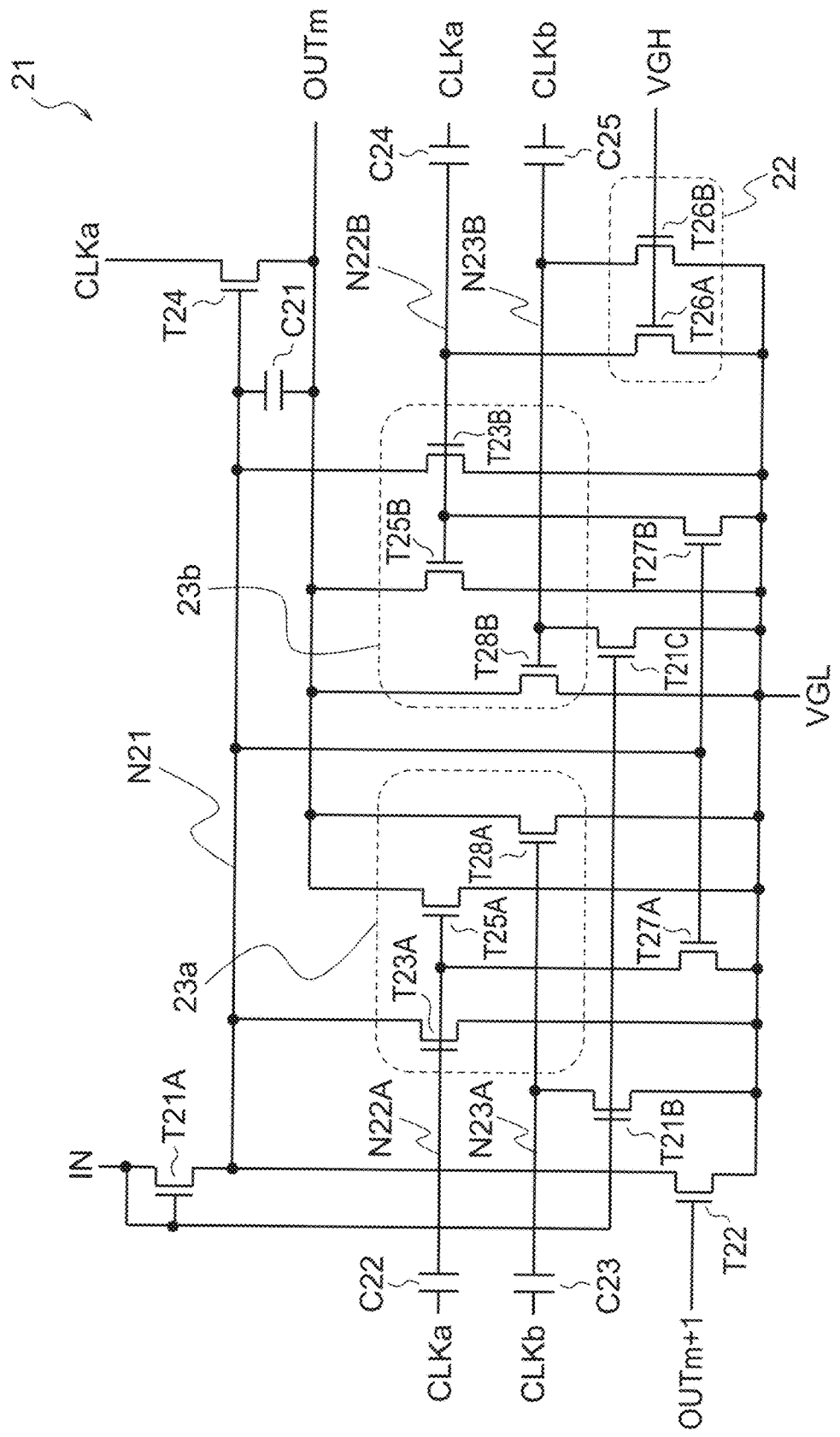
FIG. 8 is a circuit diagram showing the structure of a unit circuit according to a second exemplary embodiment.
Figure 9:
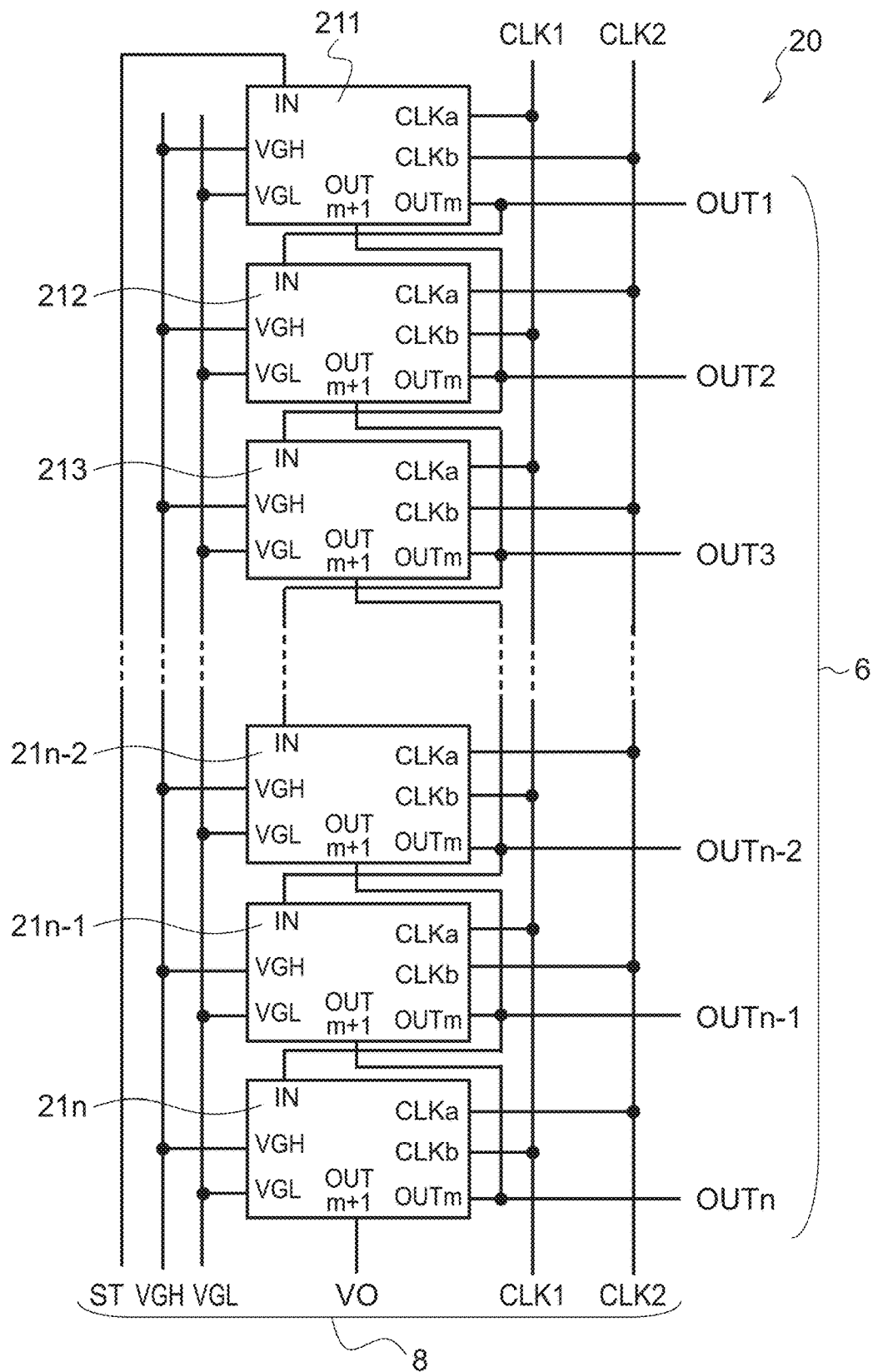
FIG. 9 is a block diagram showing the structure of the scanning circuit according to the second exemplary embodiment.

As shown in FIG. 8, the unit circuit 21 of the second exemplary embodiment is constituted with a plurality of transistors T21A to T28B, capacitors C21 to C25, and wirings as well as terminals to be described later. Those terminals are the input terminals IN, CLKa, CLKb, OUTm+1, VGH, VGL, and the output terminal OUTm.

The first pulldown circuit 23a is constituted with the transistors T23A, T25A, and T28A, and has a function of setting the node N21 and the output terminal OUTm to VGL. The second pulldown circuit 23b is constituted with the transistors T23B, T25B, and T28B, and has a function of setting the node N21 and the output terminal OUTm to VGL. The switching circuit 22 is constituted with the transistors T26A, T26B and has a function of setting the nodes N22B, N23B to VGL.

The node N21 shows the wiring connected to the source of the transistor T21A, the drain of the transistor T22A, the drain of the transistor T23A, the drain of the transistor T23B, the gate of the transistor T27A, the gate of the transistor T27B, and the gate of the transistor T24. The node N22A shows the wiring connected to the gate of the transistor T23A, the gate of the transistor T25A, the drain of the transistor T27A, and one of the electrodes of the capacitor C22. The node N22B shows the wiring connected to the gate of the transistor T23B, the gate of the transistor T25B, the drain of the transistor T27B, the drain of the transistor T26A, and one of the electrodes of the capacitor C24, respectively. The node N23A shows the wiring connected to the drain of the transistor T31B, the gate of the transistor T28A, and one of the electrodes of the capacitor C23. The node N23B shows the wiring connected to the drain of the transistor T21C, the drain of the transistor T26B, the gate of the transistor T28B, and one of the electrodes of the capacitor C25, respectively.

The transistor T21A is gate-controlled by the potential of the input terminal IN, and has a function of increasing the potential of the node N21. The transistor T21B is gate-controlled by the potential of the input terminal IN, and has a function of setting the node N23A to VGL. The transistor T21C is gate-controlled by the potential of the input terminal IN, and has a function of setting the node N23B to VGL. The transistor T22 is gate-controlled by the potential of the input terminal OUTm+1, and has a function of setting the node N21 to VGL. The transistor T23A (T23B) is gate-controlled by the potential of the node N22A (node N22B), and has a function of setting the node N21 to VGL. The transistor T24 is gate-controlled by the potential of the node N21, and has a function of supplying the potential of the input terminal CLKa to the output terminal OUTm or electrically isolating the output terminal OUTm and the input terminal CLKa. The transistor T25A (T25B) is gate-controlled by the potential of the node N22A (N22B), and has a function of setting the output terminal OUTm to VGL. The transistor T26A (T26B) has its gate connected to VGH, the source connected to VGL, and the drain connected to the node N22B (N23B), and has a function of setting the node N22B (N23B) to VGL. The transistor T27A (T27B) is gate-controlled by the potential of the node N21, and has a function of setting the node N22A (N22B) to VGL. The transistor T28A (T28B) is gate-controlled by the node N23A (node N23B), and has a function of setting the output terminal OUTm to VGL.

Because the transistors T26A, T26B are provided, it is possible to stop the operation of the transistors T23B, T25B, and T28B while the transistors T23A, T25A, and T28A are in operation. The capacitor C21 has one of the electrodes connected to the node N21 and the other electrode connected to the output terminal OUTm, and includes a function which accumulates the electric charges so that the potential of the node N21 does not fluctuate by the leak current and the like of the transistors T21A, T22, T23A, and T23B. The capacitor C22 (C24) is the static capacitance required for coupling-driving the node N22A (N22B) by the potential fluctuation of the input terminal CLKa. The capacitor C23 (C25) is the static capacitance required for coupling-driving the node N23A (N23B) by the potential fluctuation of the input terminal CLKb. Because the switching circuit 22 is provided, it is possible to stop the operation of the second pulldown circuit 23b while the first pulldown circuit 23a is in operation.

Figure 10:
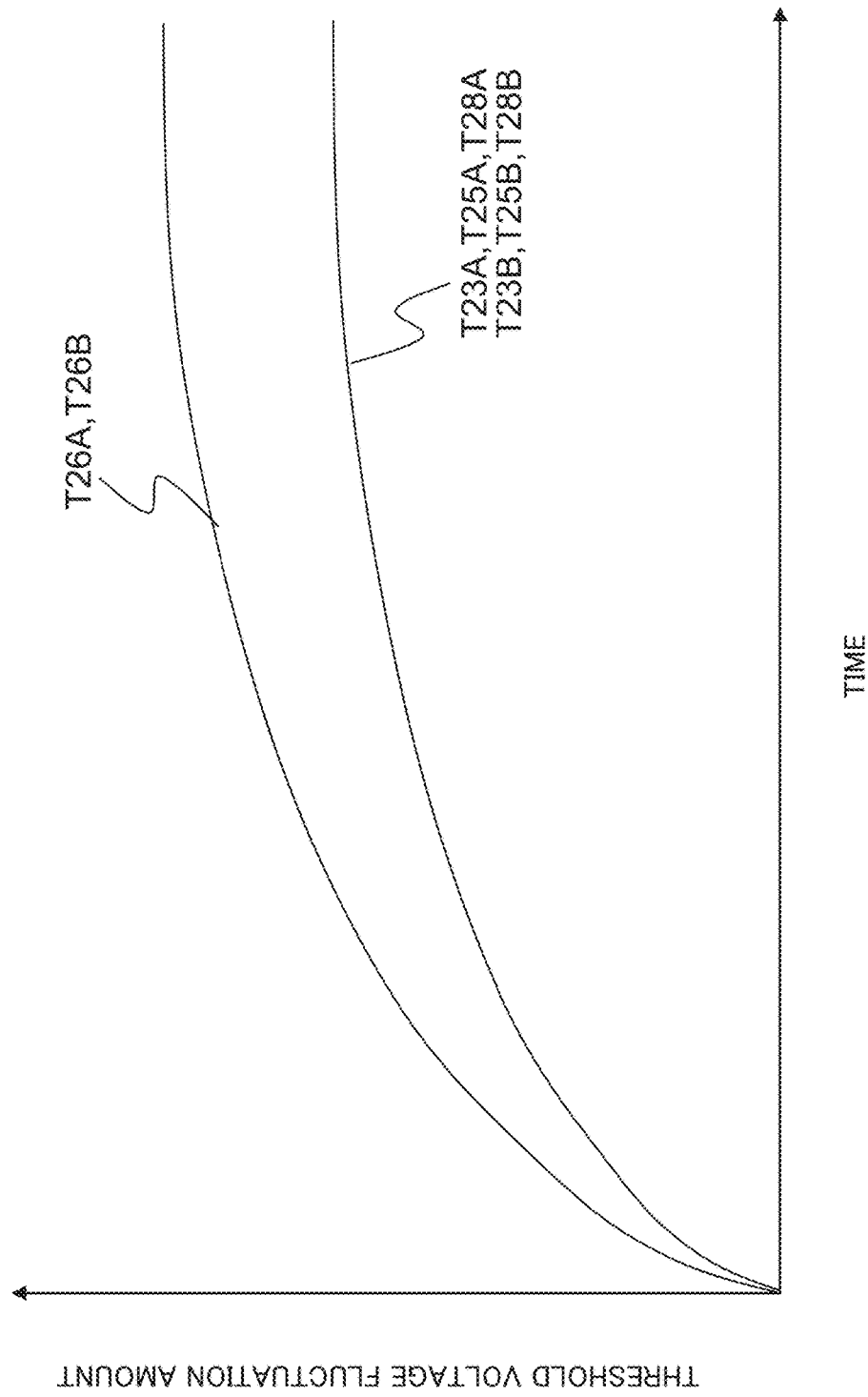
FIG. 10 is a graph showing the property fluctuation of a transistor that forms the unit circuit according to the second exemplary embodiment.

Note here that it is desirable to design the physical shapes and the sizes of each transistor and the capacitor so that the circuit can operate with a sufficient margin. Further, the threshold voltages of the transistors T23A, T23B, T25A, T25B, T28A, T28B, T26A, and T26B are fluctuated when the "plus gate stress" is applied while the circuit in operation. To the gates of the transistors T23A, T23B, T25A, T25B, T28A, and T28B, pulse signals synchronizing with the clock signals CLK1, CLK2 supplied to the input terminals CLKa, CLKb are applied as will be described later. In the meantime, VGH that is a DC signal is applied to the gates of the transistors T26A and T26B. That is, the "plus gate stress" to be applied to the transistors T26A, T26B is larger than that applied to the transistors T23A, T23B, T25A, T25B, T28A, and T28B. Thus, as shown in FIG. 10, the shift amount of the threshold voltage over the time becomes larger in the transistors T26A, T26B than that in the transistors T23A, - - - .

The scanning circuit 20 (FIG. 9) which drives the display device in the second exemplary embodiment includes the unit circuit 21 (FIG. 8) as the structural element thereof. The unit circuit 21 is provided with: a plurality of transistors (the first and second pulldown circuits 23a, 23b) which maintain the node N21 and the output terminal OUTm to VGL and set those not to be in a floating state; and the switching circuit 22 which switches the second pulldown circuit 23b to an operating state from an operation stop state.

During the operation of the first pulldown circuit 23a, "plus gate stress" is applied to the transistors T23A and the like constituting the first pulldown circuit 23a and the switching circuit 22, so that the threshold voltage is fluctuated over the time. Note here that the "plus gate stress" to be applied to the transistors T23A and the like constituting the first pulldown circuit 23a is larger than that applied to the transistors T26A, T26B constituting the switching circuit 22. Thus, the switching circuit 22 comes to be in an operation stop state earlier than the first pulldown circuit 23a. That is, it becomes difficult for the switching circuit 22 to maintain the second pulldown circuit 23b to be in an operation stop state, so that the second pulldown circuit 23b is changed to an operating state from the operation stop state. Thereby, the capacity for setting the node N11 and the output terminal OUTm to VGL can be maintained.

Further, it becomes unnecessary to have a means for detecting the operation state of the transistors T23A, T23A, T28A and also unnecessary to have a special control signal for releasing the operation stop state of the transistors T23B, T25B, T28B. Therefore, there is no increase in the circuit scale and in the cost for the external control module. Furthermore, unlike the case of the first exemplary embodiment, no through-current is flown during the operation of the unit circuit 21 in the second exemplary embodiment. Therefore, it is possible with the second exemplary embodiment to achieve the scanning circuit of low power consumption further while acquiring the same effects as those of the first exemplary embodiment.

(Explanations of Actions)

Next, actions of the scanning circuit 20 according to the second exemplary embodiment will be described.

Figure 11:
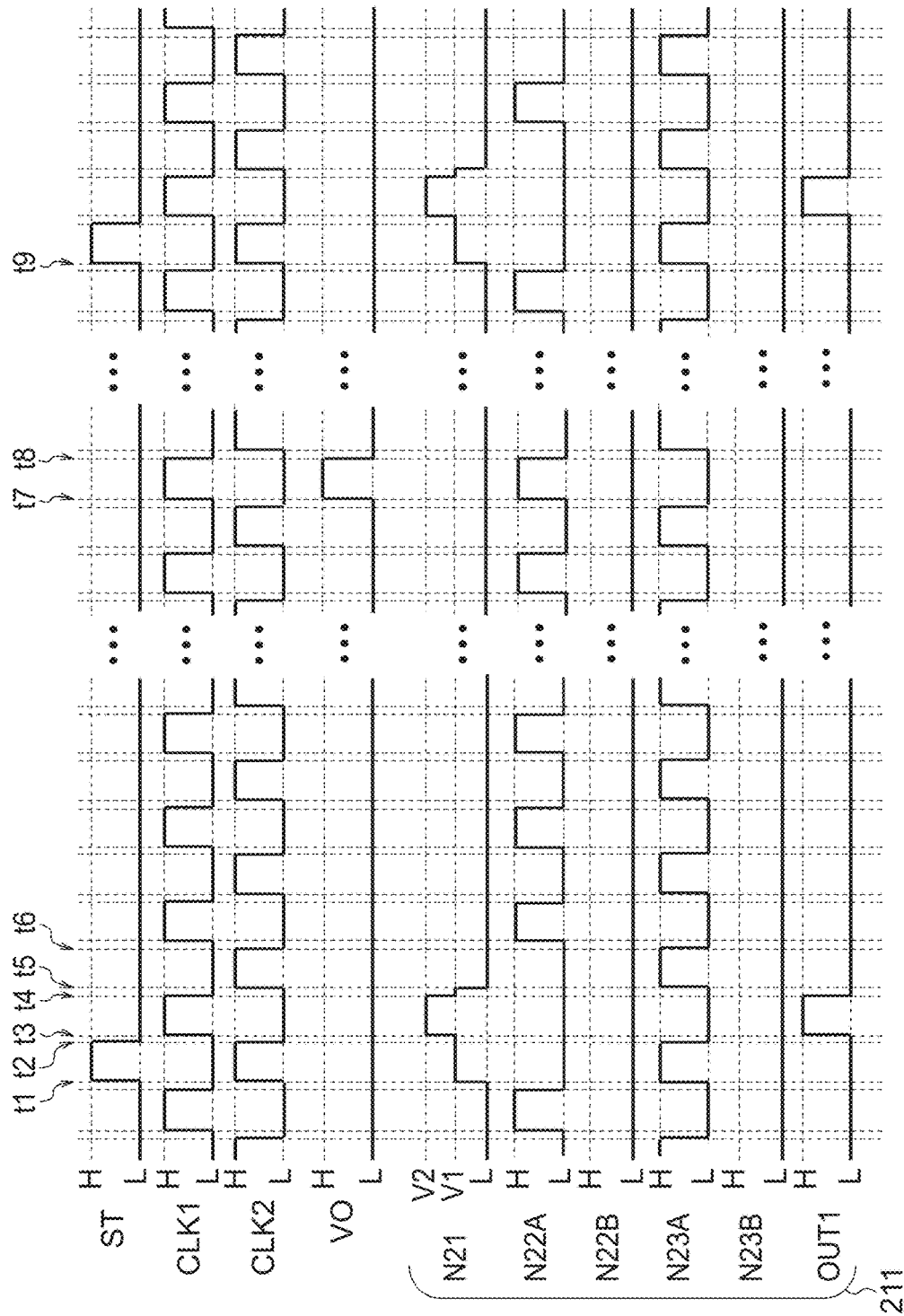
FIG. 11 is a first timing chart showing actions of the unit circuit according to the second exemplary embodiment.
Figure 12:
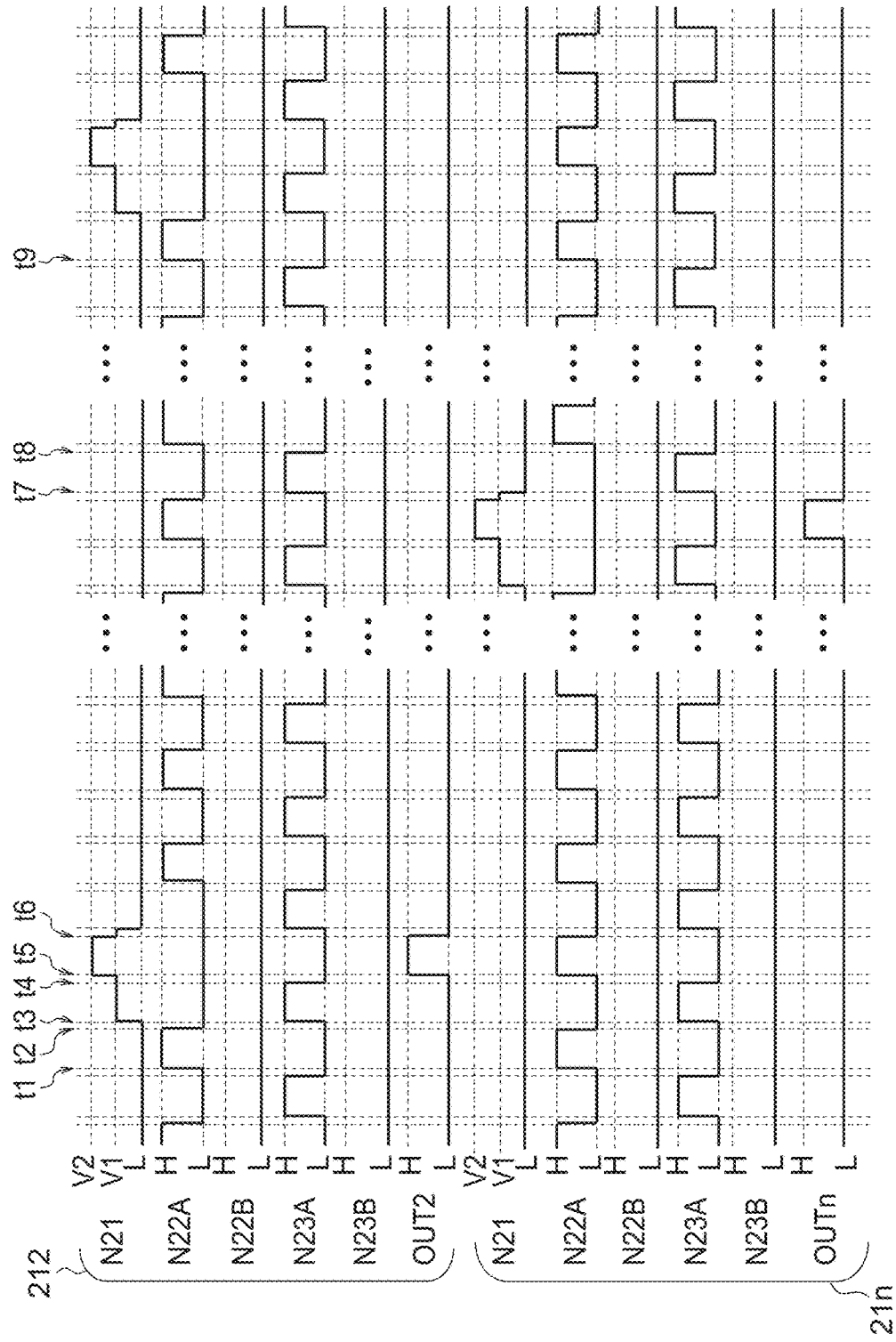
FIG. 12 is a second timing chart showing actions of the unit circuit according to the second exemplary embodiment.

The actions of the scanning circuit 20 and the unit circuit 21 will be described by adding the drawings from FIG. 11 to FIG. 13 to the drawings from FIG. 8 to FIG. 10. In FIG. 11 and FIG. 12, the lateral axis shows the time and the longitudinal axis shows the potentials of each terminal. L and H in the longitudinal axis are abbreviations of VGL and VGH, respectively. The longitudinal axis in FIG. 11 shows the potentials of each terminal of the control signal line 8 and the unit circuit 211, and the longitudinal axis in FIG. 12 shows the potentials of each terminal of the unit circuits 212, 21n. Further, in FIG. 13, the lateral axis shows the time and the longitudinal axis shows the fluctuation amount of the threshold voltage in each transistor.

Period (t1 to t2)

The start signal ST is changed to VGH from VGL. The clock signal CLK1 is VGL. Further, the clock signal CLK2 is changed to VGH from VGL.

Actions of Unit Circuit 211: Since the transistor T21A is turned to an on-state, the node N21 is increased from VGL to V1 (=VGH−VGL−Vth) provided that the threshold voltage of the transistor T21A is Vth. Thereby, the transistor T24 comes to be in an on-state. The clock signal CLK1 connected to the input terminal CLKa is VGL, so that the output signal OUT1 is set to VGL by the transistor T24. Further, the transistor T21B comes to be in an on-state, so that the node N23A is set to VGL. Thus, the transistor T28A is in an off-state. In the meantime, the transistors T27A and T27B both come to be in an on-state because the potential of the node N21 is increased, so that the nodes N22A and N22B are set to VGL. Therefore, the transistors T23A, T25A, T23B, and T25B are in an off-state.

Actions of Unit Circuits 212 to 21n: The node N21 is VGL, so that the output signals OUT2 to OUTn are all VGL.

Period (t3 to t4)

The start signal ST is changed to VGL from VGH. The clock signal CLK1 is changed over to VGH from VGL, and the clock signal CLK2 is VGL.

Actions of Unit Circuit 211: The transistors T21A and T21B are turned to an off-state. Thereby, the nodes N21 and N23A come to be in a floating state. In the meantime, the clock signal CLK1 is turned to VGH, so that it passes through the transistor T24 in an on-state and the potential of the output signal OUT1 is increased from VGL. At this time, since the potential of the output signal OUT1 as one of the electrodes of the capacitor C21 is increased, the potential of the other electrode (node N21) of the capacitor C21 in a floating state is increased further to V2 (=2(VGH−VGL)−Vth) due to a bootstrap effect provided that the threshold voltage of the transistor T21A is Vth. Thus, a voltage of VGH or higher is applied to the gate of the transistor T24, so that the potential of the output signal OUT1 is changed up to VGH without being attenuated.

Actions of Unit Circuit 212: As in the actions of the unit circuit 111 in the period (t1 to t2), the transistors T21A, T21B, and T24 come to be in an on-state.

Actions of Unit Circuits 213 to 21n: The node N21 is VGL, so that the output signals OUT3 to OUTn are all VGL.

Period (t5 to t6)

The clock signal CLK1 is VGL. The clock signal CLK2 is changed to VGH from VGL.

Actions of Unit Circuit 211: The output signal OUT2 of the unit circuit 212 of the latter stage is changed to VGH, so that VGH is inputted to the input terminal OUTm+1 of the unit circuit 211. Thereby, the transistor T22 comes to be in an on-state, so that the node N21 is set to VGL.

Actions of Unit Circuit 212: As in the actions of the unit circuit 211 in the period (t3-t4), the potential of the output signal OUT2 is changed over to VGH. Because of this action, VGH is applied to the input terminal OUTm+1 of the unit circuit 211.

Actions of Unit Circuit 213: The actions are same as those of the unit circuit 211 in the period (t1 to t2).

Actions of Unit Circuits 214 to 21n: The node N21 is VGL, so that the output signals OUT4 to OUTn are all VGL.

After the time t6, the actions of the unit circuits 214 to 21n−1 are the same as the actions of the unit circuit 211 in the period (t1 to t6). With such actions, OUT4 to OUTn are sequentially changed to VGH.

Period (t7 to t8)

The final-stage control signal VO is changed over to VGH from VGL.

Actions of Unit Circuit 21n: Since the potential of the input terminal OUTm+1 is turned to VGH, the transistors T22 comes to be in an on-state. As in the actions of the unit circuit 211 in the period (t5 to t6), the node N21 and the output terminal OUTm are changed to VGL.

After the time t8, the actions same as those of after the time t1 are repeated at the timing (time t9) where the start signal ST is changed to VGH from VGL.

Next, transitions of the threshold voltages generated over the time regarding each of the transistors constituting the first and second pulldown circuits 23a, 23b and the switching circuit 22 within the unit circuit 21 will be described by referring to FIG. 13. As has been described earlier, the transistors T26A, T26B correspond to the switching circuit 22, the transistors T23A, T25A, T28A correspond to the first pulldown circuit 23a, and the transistors T23B, T25B, T28B correspond to the second pulldown circuit 23b, respectively.

Time (1): The threshold voltages of each of the transistors are in a state of the initial value and are all equivalent. After starting the operation, the "plus gate stress" is applied to the transistors T23A, T25A, T28A, T26A, and T26B by the actions of the unit circuit 21 described above. Thereby, the threshold voltages of the transistors T23A, - - - are increased. At that time, the amount of the "plus gate stress" applied to the transistor T26A, T26B is larger than that applied to the transistors T23A, T25A, and T28B, so that the threshold voltage thereof becomes still higher. In the meantime, the transistors T23B, T25B, and T28B are all in an off-state because of the actions of the transistors T26A, T26B. Thus, the "plus gate stress" is not applied, so that the threshold voltage is remained as the initial value.

Time (2): Because the threshold voltages of the transistors T26A, T26B are increased and reach the limit value, the transistors T23B, T25B, and T28B cannot be maintained in an off-state. Thereafter, the potentials of the nodes N22B, N23B are fluctuated because of the coupling action via the capacitors C24, C25 caused by the fluctuation in the potentials of the input terminals CLKa, CLKb. Thus, there is generated a period where the transistors T23B, T25B, and T28 are turned to be in an on-state. Thus, after the time (2), the "plus gate stress" is applied also to the transistors T23B, T25B, and T28B. Thereby, the threshold voltages of the transistors T23B, T25B, and T28B are increased.

Time (3): The threshold voltages of the transistors T23A, T25A, and T28A are further increased and reach the limit value, so that the node N21 and the output terminal OUTm cannot be maintained to VGL in the transistors T23A, T25A, and T28A. However, the capacity for maintaining the node N21 and the output terminal OUTm to VGL in the transistors T23B, T25B, and T28B is remained. This makes it possible to maintain the node N21 and the output terminal OUTm to VGL.

As described above, the scanning circuit 20 which drives the display device according to the second exemplary embodiment includes the unit circuit 21 that is the structural element thereof. In the unit circuit 21, a plurality of transistors T23A, T23B, - - - for maintaining the node N21 and the output terminal OUTm to VGL and setting those not to be in a floating state are provided and also the transistors T26A, T26B for stopping the operations of the transistors T23B, T25B, and T28B are provided.

Further, during the operation of the transistors T26A, T26B, the "plus gate stress" is applied to the transistors T23A, T25A, T28A, T26A, and T26B, so that the threshold voltages thereof become increased over the time. At this time, the threshold voltages of the transistor T26A, T26B become increased more since the "plus gate stress" applied to the transistors T26A, T26B is larger than that applied to the transistors TT23A, T25A, and T28A. Therefore, even when the transistors T23A, T25A, and T28A become unable to maintain the node N21 and the output terminal OUTm to VGL, the capacity for setting the node N21 and the output terminal OUTm to VGL can be maintained since the operation stop state of the transistors T23B, T25B, and T28B is released by the transistors T26A, T26B. Thereby the circuit life of the scanning circuit 20 can be extended.

As described, it is possible with the scanning circuit 20 of the second exemplary embodiment to achieve a display device exhibiting the same effects as those of the first exemplary embodiment even when different structures from those of the first exemplary embodiment are used for the unit circuit 21 that constitutes the scanning circuit 20. Other structures, operations, and effects of the second exemplary embodiment are same as those of the first exemplary embodiment.

Third Exemplary Embodiment (Explanations of Structures)
A third exemplary embodiment is different from the first and second exemplary embodiments in terms of the structures of the scanning circuit and the unit circuit. An arbitrary unit circuit out of unit circuits 311 to 31n in FIG. 15 is shown as a unit circuit 31 in FIG. 14. Further, the structures of the display device of the first exemplary embodiment shown in FIG. 7A and the structures of the first substrate shown in FIG. 7B are also applied to the third exemplary embodiment.

As shown in FIG. 15, the scanning circuit 30 of the third exemplary embodiment includes a plurality of unit circuits 311 to 31n. Other structures of the scanning circuit 30 are same as those of the scanning circuit of the second exemplary embodiment.

Figure 14:
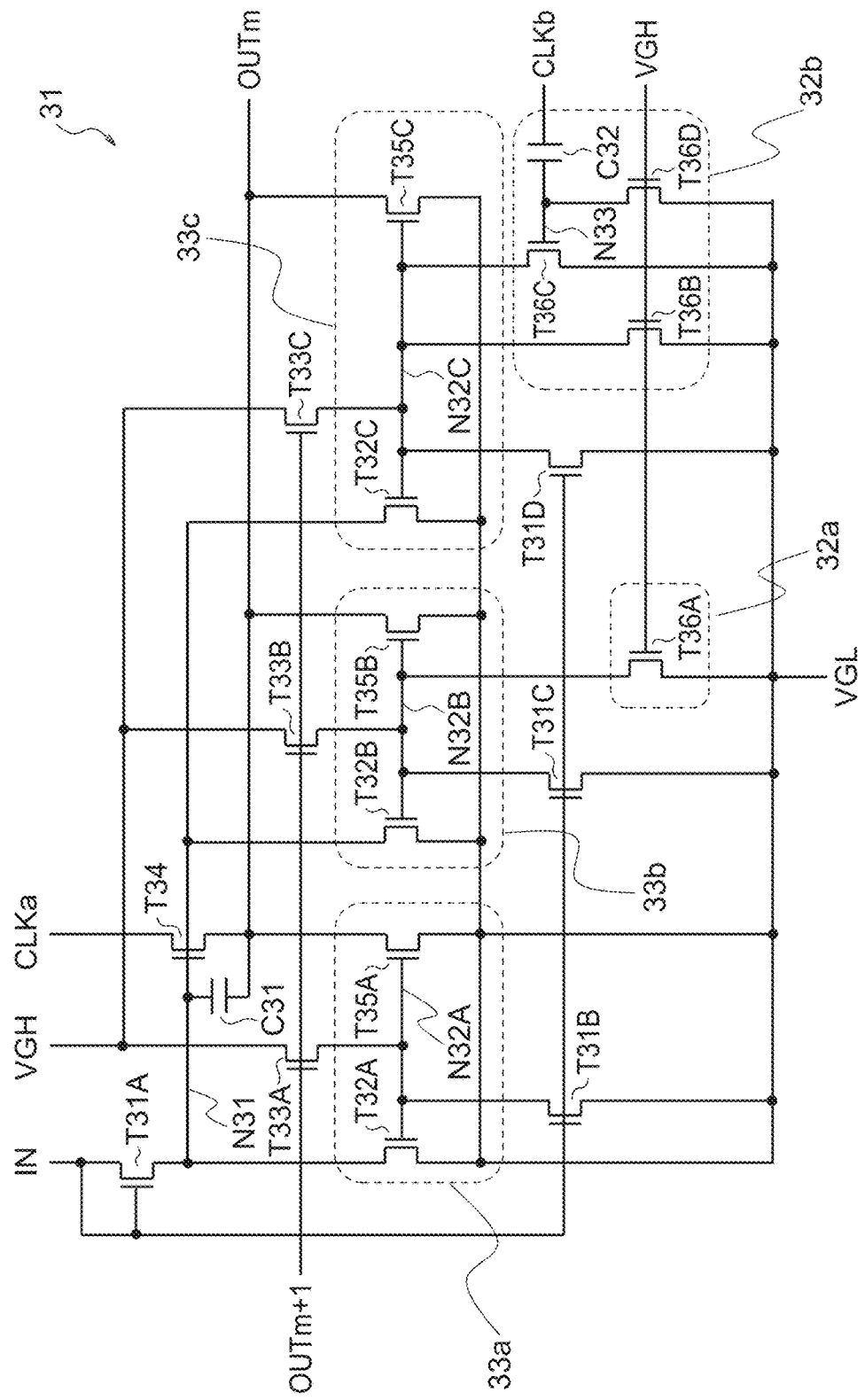
FIG. 14 is a circuit diagram showing the structure of a unit circuit according to a third exemplary embodiment.
Figure 15:
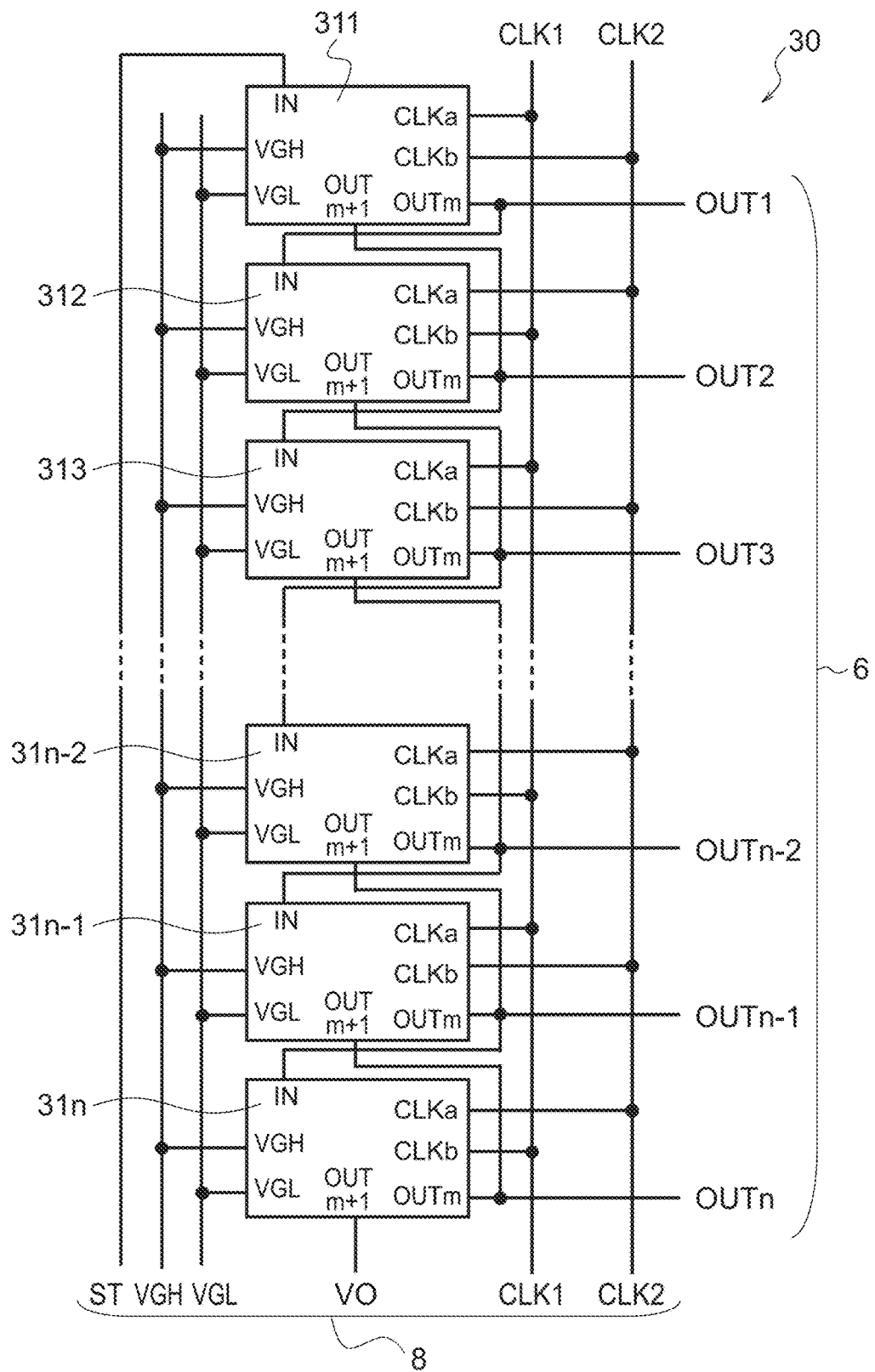
FIG. 15 is a block diagram showing the structure of the scanning circuit according to the third exemplary embodiment.

As shown in FIG. 14, the unit circuit 31 of the third exemplary embodiment is constituted with a plurality of transistors T31A to T36D, capacitors C31, C32, and wirings as well as terminals to be described later. Those terminals are the input terminals IN, CLKa, CLKb, OUTm+1, VGH, VGL, and the output terminal OUTm.

The first pulldown circuit 33a is constituted with the transistors T32A, 35A, and has a function of setting the node N31 and the output terminal OUTm to VGL. The second pulldown circuit 33b is constituted with the transistors T32B, T35B, and has a function of setting the node N31 and the output terminal OUTm to VGL. The third pulldown circuit 33c is constituted with the transistors T32C, T35C, and has a function of setting the node N31 and the output terminal OUTm to VGL.

The first switching circuit 32a is constituted with the transistor T36A and has a function of setting the node N32B to VGL. The second switching circuit 32b is constituted with the transistors T36B, T36C, T36D, and the capacitor C32, and has a function of setting the node N32C to VGL.

The node N31 shows the wiring connected to the source of the transistor T31A, the drain of the transistor T32A, the drain of the transistor T32B, the drain of the transistor T32C, the gate of the transistor T34. The node N32A shows the wiring connected to the drain of the transistor T31B, the gate of the transistor T32A, the gate of the transistor T35A, and the source of the transistor T33A. The node N32B shows the wiring connected to the gate of the transistor T32B, the gate of the transistor T35B, the source of the transistor T33B, and the drain of the transistor T36A. The node N32C shows the wiring connected to the gate of the transistor T32C, the gate of the transistor T35C, the source of the transistor T33C, the drain of the transistor T36B, and the drain of the transistor T36C. The node N33 shows the wiring connected to the gate of the transistor T36C, one of the electrodes of the capacitor C32, and the drain of the transistor T36D.

The transistor T31A is gate-controlled by the potential of the input terminal IN, and has a function of increasing the potential of the node N31. The transistor T31B is gate-controlled by the potential of the input terminal IN, and has a function of setting the node N32A to VGL. The transistor T31C is gate-controlled by the potential of the input terminal IN, and has a function of setting the node N32B to VGL. The transistor T31D is gate-controlled by the potential of the input terminal IN, and has a function of setting the node N32C to VGL. The transistor T32A (T32B, T32C) is gate-controlled by the potential of the node N32A (N32B, B32C), and has a function of setting the node N31 to VGL. The transistor T33A (T33B, T33C) is gate-controlled by the potential of the input terminal OUTm+1, and has a function of increasing the potential of the node N32A (N32B, N32C). The transistor T34 is gate-controlled by the potential of the node N31, and has a function of supplying the potential of the input terminal CLKa to the output terminal OUTm or electrically isolating the output terminal OUTm and the input terminal CLKa. The transistor T35A (T35B, T35C) is gate-controlled by the potential of the node N32A (N32B, N32C), and has a function of setting the output terminal OUTm to VGL. The transistor T36A (T36B, T36D) has its gate connected to VGH, the source connected to VGL, and the drain connected to the node N32B (N32C, N33), respectively, and has a function of setting the node N32B (N32C, N33) to VGL. The transistor T36C has its gate connected to the node N33, the source connected to VGL, and the drain connected to the node N32C, respectively, and has a function of setting the node N32C to VGL.

The capacitor C31 has one of the electrodes connected to the node N31 and the other electrode connected to the output terminal OUTm, and includes a function which accumulates the electric charges so that the potential of the node N31 does not fluctuate by the leak current and the like of the transistors T31A, T32A, and T32B, noise mixed from outside, and the like. The capacitor C32 is a coupling capacitance for transmitting the potential fluctuation of the input terminal CLKb to the node N33.

Figure 16:
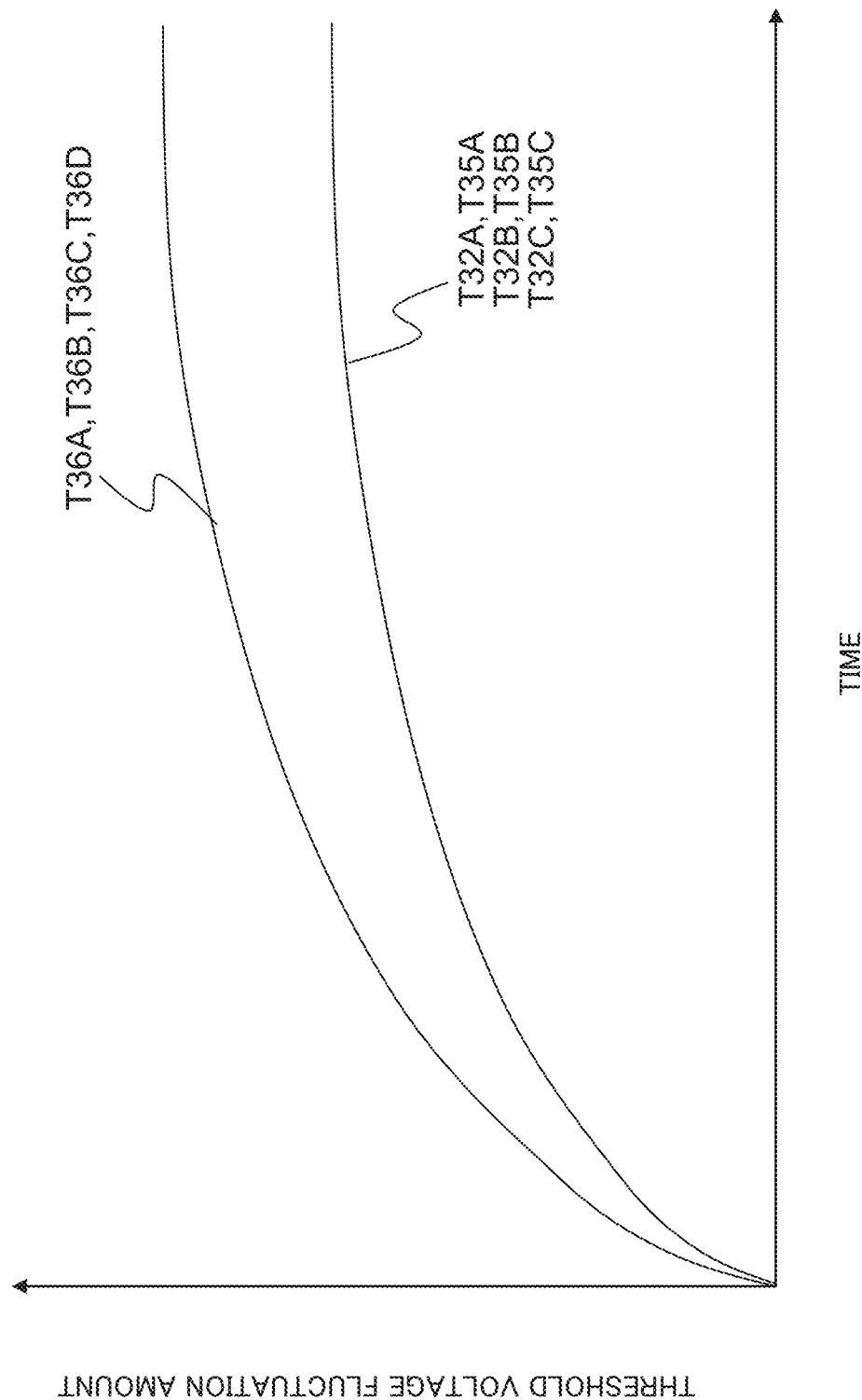
FIG. 16 is a graph showing the property fluctuation of a transistor that forms the unit circuit according to the third exemplary embodiment.

Note here that it is desirable to design the physical shapes and the sizes of each transistor and the capacitor so that the circuit can operate with a sufficient margin. Further, regarding the transistors T32A, T35A, T32B, T35B, T32C, T35C, T36A, T36B, T36C, and T36D, the threshold voltages thereof are fluctuated when the "plus gate stress" is applied during the circuit operation. The "plus gate stress" to be applied to the transistors T36A, T36B, T36C, and T36D is larger than that applied to the transistors T32A, T32B, T32C, T35A, T35B, and T35C. Thus, as shown in FIG. 16, the shift amount in the threshold voltage over the time becomes larger in the transistors T36A, - - - than that in the transistors T32A, - - - -. Also, it is desirable to employ the design with which the driving capacity of the transistors constituting the first to third pulldown circuits 33a, 33b, and 33c becomes higher than the driving capacity of the transistors constituting the first and second switching circuits 32a, 32b.

The scanning circuit 30 which drives the display device in the third exemplary embodiment includes the unit circuit 31 as the structural element thereof. The unit circuit 31 is provided with: a plurality of transistors (the first to third pulldown circuits 33a, 33b, 33c) which maintain the node N21 and the output terminal OUTm to VGL and set those not to be in a floating state; and the first and second switching circuit 32a and 32b for switching the second and third pulldown circuits 33b, 33c to an operating state from an operation stop state.

During the operation of the first pulldown circuit 33a, "plus gate stress" is applied to the transistors T32A, T35A, T36A, T36B, and T36D, so that the driving capacity thereof is decreased over the time. Since the driving capacity of the transistors T32A, T35A is higher than that of the transistors T36A, T36B, and T36D, the transistors T36A, T36B, and T36D lose the driving capacity earlier than the transistors T32A, T35A. When the driving capacity of the transistor T36A is lost, the operation stop state of the transistors T32B, T35B is released. Therefore, the second pulldown circuit 33b is changed over to an operating state from the operation stop state. That is, the capacity for setting the node N31 and the output terminal OUTm to VGL can be maintained.

Further, even when the second pulldown circuit 33b is changed to an operation state from an operating state, the third pulldown circuit 33c is changed to an operating state from an operation stop state by the second switching circuit 32b so that the capacity for setting the node N31 and the output terminal OUTm to VGL can be maintained. Therefore, it is possible with the third exemplary embodiment to extend the circuit life of the scanning circuit still longer than the cases of the first and second exemplary embodiments.

Further, it becomes unnecessary to have a means for detecting the operation state of the transistors T32A, T32B, T35A, T35B and also unnecessary to have a special control signal for releasing the operation stop state of the transistors T32B, T32C, T35B, and T35C. Therefore, there is no increase in the circuit scale and in the cost for the external control module.

(Explanations of Actions)

Next, actions of the scanning circuit 30 according to the third exemplary embodiment will be described.

Figure 17:
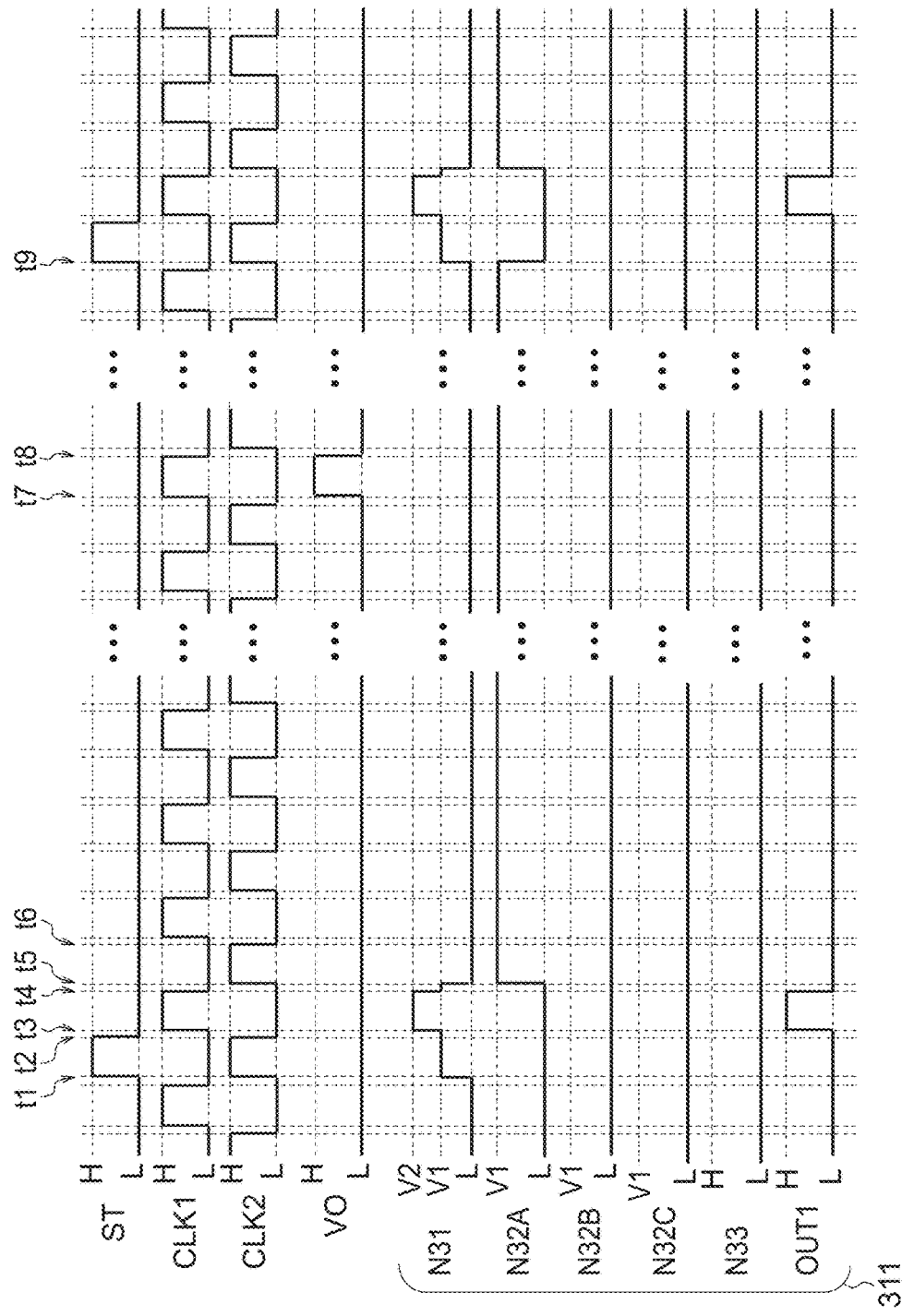
FIG. 17 is a first timing chart showing actions of the unit circuit according to the third exemplary embodiment.
Figure 18:
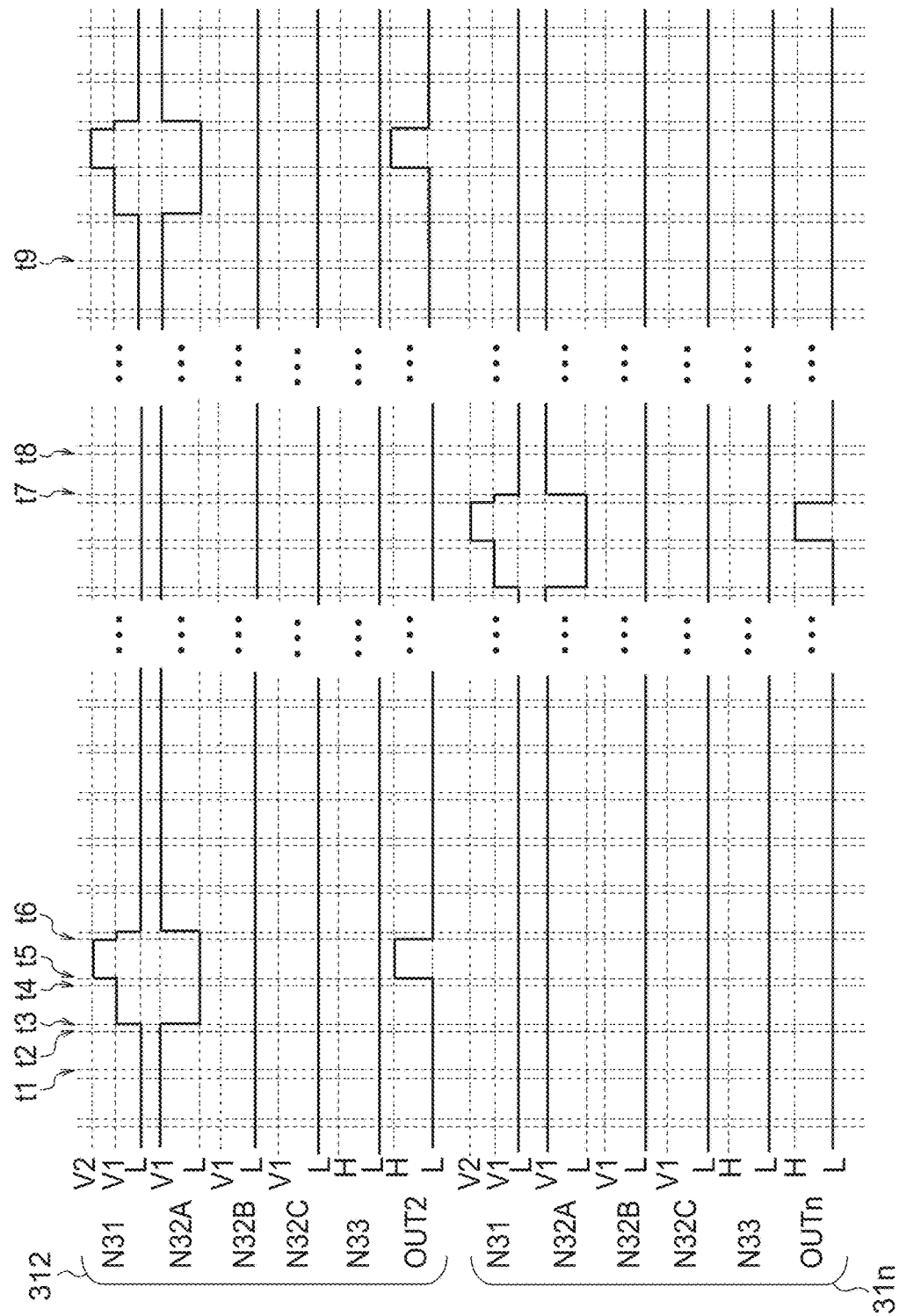
FIG. 18 is a second timing chart showing actions of the unit circuit according to the third exemplary embodiment.

The actions of the scanning circuit 30 and the unit circuit 31 will be described by adding the drawings from FIG. 17 to FIG. 19 to the drawings from FIG. 14 to FIG. 16. In FIG. 17 and FIG. 18, the lateral axis shows the time and the longitudinal axis shows the potentials of each terminal. L and H in the longitudinal axis are abbreviations of VGL and VGH, respectively. The longitudinal axis in FIG. 17 shows the potentials of each terminal of the control signal line 8 and the unit circuit 311, and the longitudinal axis in FIG. 17 shows the potentials of each terminal of the unit circuits 312, 31n. Further, in FIG. 19, the lateral axis shows the time and the longitudinal axis shows the fluctuation amount of the threshold voltage in each transistor.

Period (t1 to t2)

The start signal ST is changed to VGH from VGL. The clock signal CLK1 is changed to VGL from VGH, and the clock signal CLK2 is changed to VGH from VGL, respectively.

Actions of Unit Circuit 311: Since the transistor T31A is turned to an on-state, the node N31 is increased from VGL to V1 (=VGH−VGL−Vth) provided that the threshold voltage of the transistor T31A is Vth. Thereby, the transistor T34 comes to be in an on-state. However, the output signal OUT1 is remained as VGL. Further, the node N32A is set to VGL because the transistor T31B comes to be in an on-state, so that the transistors T32A, T35A are in an off-state. In the meantime, the transistor T36A is in an on-state, so that the node N32B is VGL. Thus, the transistors T32B and T35B are in an off-state. Since the transistor T36B is in an on-state, the node N32C is VGL.

Actions of Unit Circuits 312 to 311n: The nodes N31, N32A, N32B, and N32C are all VGL, so that the output signals OUT2 to OUTn are all VGL.

Period (t3 to t4)

The start signal ST is changed to VGL from VGH. The clock signal CLK1 is changed to VGH from VGL, and the clock signal CLK2 is changed to VGL from VGH, respectively.

Actions of Unit Circuit 311: The transistors T31A, T31B, T31C, and T31D are turned to an off-state. Thereby, the nodes N31 and N32A come to be in a floating state. The node N32B (N32C) is set to VGL by the transistor T36A (T36B). The node N33 is set to VGL by the transistor T36D. The clock signal CLK1 is turned to VGH, so that it passes through the transistor T34 in an on-state and the potential of the output signal OUT1 is increased from VGL. The potential of the output signal OUT1 as one of the electrodes of the capacitor C31 is increased, the potential of the other electrode (node N31) in a floating state is increased further to V2 (>>VGH) due to a bootstrap effect. Thus, a voltage of VGH or higher is applied to the gate of the transistor T34, so that the potential of the output signal OUT1 is changed up to VGH without being attenuated.

Actions of Unit Circuit 312: As in the actions of the unit circuit 311 in the period (t1 to t2), the transistors T31A, T31B, and T34 come to be in an on-state.

Actions of Unit Circuits 313 to 31n: The node N31, N32A, N32B, N32C, and N33 are all VGL, so that the output signals OUT3 to OUTn are all VGL.

Period (t5 to t6)

The clock signal CLK1 is changed to VGL from VGH, and the clock signal CLK2 is changed to VGH from VGL, respectively.

Actions of Unit Circuit 311: As will be described later, the output signal OUT2 of the unit circuit 312 is changed to VGH. Thus, VGH is inputted to the input terminal OUTm+1 of the unit circuit 311. Therefore, the transistors T33A, T33B, and T33C all come to be in an on-state. Provided that the threshold voltage of the transistor T33A is Vth, the node N32A is changed from VGL to V1 (=VGH−VGL−Vth) by the transistor T33A. Thereby, the transistors T32A and T35A both come to be in an on-state, and the node N31 and the output terminal OUTm are changed to VGL. Since the driving capacity of the transistor T36A is set to be higher than the driving capacity of the transistor T33B, the node N32B is not increased to VGH. Therefore, the transistors T32B and T35B are maintained to be in an off-state. Similarly, the driving capacity of the transistor T36B is set to be higher than the driving capacity of the transistor T33C, so that the node N32C is not increased to VGH. Therefore, the transistors T32C and T35C are maintained to be in an off-state.

Actions of Unit Circuit 312: As in the actions of the unit circuit 311 in the period (t3 to t4), the transistors T31A and T31B come to be in an off-state, and the potential of the output signal OUT2 is changed to VGH.

Actions of Unit Circuit 313: The actions are same as those of the unit circuit 311 in the period (t1 to t2).

Actions of Unit Circuits 314 to 31n: The nodes N31, N32A, N32B, N32C, and N33 are all VGL, so that the output signals OUT4 to OUTn are all VGL.

After the time t6, the actions of the unit circuits 314 to 31n-1 are the same as the actions of the unit circuit 311 in the period (t1 to t6). With such actions, OUT4 to OUTn are sequentially changed over to VGH.

Period (t7 to t8)

The final-stage control signal VO is changed over to VGH from VGL.

Actions of Unit Circuit 11n: Since the potential of the input terminal OUTm+1 is turned to VGH, the transistors T33A and T33B come to be in an on-state. As in the actions of the unit circuit 311 in the period (t3 to t4), the node N31 and the output terminal OUTm are changed over to VGL.

After the time t8, the actions same as those of after the time t1 are repeated at the timing (time t9) where the start signal ST is changed to VGH from VGL again.

Next, transitions of the threshold voltages over the time regarding each of the transistors constituting the first to third pulldown circuits 33a, 33b, 33c and the first and second switching circuits 32a, 32b will be described by referring to FIG. 19. As has been described earlier, the transistor T36A corresponds to the first switching circuit 32a, the transistors T32A, T35A correspond to the first pulldown circuit 33a, the transistors T36B, T36C, T36D correspond to the second switching circuit 32b, the transistors T32B, T35B correspond to the second pulldown circuit 33b, and the transistors T32C, T35C correspond to the third pulldown circuit 33c, respectively.

Time (1): The threshold voltages of each of the transistors T32A, T35A, T32B, T35B, T32C, T35C, T36A, T36B, T36C, and T36D are in a state of the initial values and are all equivalent. After starting the operation, the "plus gate stress" is applied to the transistors T32A, T35A, T36A, T36B, and T36D. Thereby, the threshold voltages of those transistors are increased. In the meantime, the transistors T32B, T35B are both in an off-state because of the actions of the transistor T36A, the transistors T32C, T35C are both in an off-state because of the actions of the transistor T36B, and the transistor T36 is in an off-state because of the actions of the transistor T36D, respectively. Thus, the "plus gate stress" is not applied to those transistors, so that the threshold voltages thereof are remained as the initial values.

Time (2): Because the threshold voltages of the transistors T36A, T36B, and T36D are increased and reach the limit value, the transistors T32B, T35B, and T36C cannot be maintained in an off-state. Thereafter, the potential of the nodes N32B is increased by the transistor T33B that is in an on-state, so that the transistors T32B, T35B come to be in an on-state. Further, the driving capacity of the transistor T36D is decreased and the node N32C cannot be maintained to VGL, so that the node N32C comes to be in a floating state. In that state, the potential of the node N32C is fluctuated by synchronizing with the input terminal CLKb via the capacitor C32 due to the fluctuation in the potential of the input terminal CLKb. Thus, there is generated a period where the transistor T36C is turned to be in an on-state. Therefore, after the time (2), the "plus gate stress" is applied also to the transistors T32B, T35B, and T36C. Thereby, the threshold voltages of those transistors are increased.

Time (3): The threshold voltages of the transistors T32A and T35A are further increased and reach the limit value, so that the capacity for maintaining the node N31 and the output terminal OUTm to VGL is lost. However, the node N31 and the output terminal OUTm are maintained to VGL by the transistors T32B and T35B.

Time (4): Because the threshold voltage of the transistor T36C is increased and reaches the limit value, the transistors T32C and T35C are changed to a state that cannot be maintained to an off-state. Thereafter, the potential of the node N32C is increased by the transistor T33C that is in an on-state. Thus, the transistors T32C and T35C are turned to an on-state. Therefore, after the time (4), the "plus gate stress" is applied also to the transistors T32C and T35C. Thereby, the threshold voltages of those transistors are increased.

Time (5): The threshold voltages of the transistors T32B and T35B are further increased and reach the limit value, so that the capacity for maintaining the node N31 and the output terminal OUTm to VGL is lost. However, the node N31 and the output terminal OUTm are maintained to VGL by the transistors T32C and T35C.

As described above, the scanning circuit 30 which drives the display device according to the third exemplary embodiment includes the unit circuit 31 that is the structural element thereof. In the unit circuit 31, a plurality of transistors (the first to third pulldown circuits 33a, 33b, 33c) for maintaining the node N31 and the output terminal OUTm to VGL and setting those not to be in a floating state are provided and also the first and second switching circuits 32a, 32b are provided. Even when the pull-down circuit in operation comes to be in an operation stop state, another pulldown circuit is switched to be in an operating state from the operation stop state by the switching circuit. Therefore, the capacity for setting the node N31 and the output terminal OUTm to VGL can be maintained. Thereby, the circuit life of the scanning circuit 30 can be extended.

In the third exemplary embodiment, the structure of the scanning circuit constituted with the three pulldown circuits and the two switching circuits has been described. However, it is also possible to employ a structure which includes a greater number of pulldown circuits and switching circuits. Other structures, operations, and effects of the third exemplary embodiments are same as those of the first and second exemplary embodiments.

While the present invention has been described by referring to each of the above exemplary embodiments, the present invention is not limited only to the structures and the actions of each of the above-described exemplary embodiments but includes various kinds of changes and modifications occurred to those skilled in the art without departing from the scope of the present invention. Further, the present invention also includes those acquired by combining a part of or a whole part of each of the above-described exemplary embodiments as appropriate.

For example, while each of the exemplary embodiments employs the scanning circuit as the electronic circuit, any kinds of circuits constituted with a plurality of transistors can be considered as the electronic circuit. As the electronic circuit constituted with a plurality of transistors, not only the electronic circuits constituted only with a plurality of transistors but also electronic circuits constituted with a plurality of transistors and another element (e.g., at least one of a single or a plurality of active element(s) or a single or a plurality of passive element(s)) are included. While each of the exemplary embodiments employs the pulldown circuit as the switching-target circuit and the potential setting circuit, any kinds of circuits can be considered as the switching-target circuit. The potential setting circuit is not limited to the pulldown circuit but may also be a pullup circuit which sets the node to a higher potential, for example. The single conductive type transistor is not limited to the N-channel type transistor but may also be a P-channel type transistor. In that case, the pullup circuit may be employed instead of the pulldown circuit. Regarding the applied voltage and the applied time for the gate of the thin film transistor, the electric stress becomes greater as one of or both of those become greater. The property fluctuation of the transistor includes not only the shift in the threshold voltage but also phenomena such as increase in the on-resistance and decrease in the on-current. Materials for the thin film transistor may be amorphous silicon, polysilicon, oxide semiconductor, organic semiconductor, and the like.

Next, the present invention will be described from another viewpoint.

An exemplary object of the present invention is to provide a scanning circuit which is capable of extending the circuit life greatly even when the threshold voltage of the transistors constituting the circuit is fluctuated.

The scanning circuit according to the present invention is constituted with a single conductive type thin film transistor and includes a plurality of unit circuits controlled by synchronizing with a clock signal.

The unit circuit includes N-pieces of pulldown circuits (N is a natural number of 2 or larger) for setting the nodes inside thereof to a specific potential, and (N−1)-piece of switching circuit for switching the pulldown circuits to an operating state from an operation stop state.

The thin film transistors constituting the pulldown circuits and the switching circuit during operation both undergo the property fluctuation when equivalent electric stress is applied thereto. The pulldown circuit in operation comes to be in an operation stop state by the property fluctuation, and the switching circuit in operation switches another pulldown circuit to an operating state from an operation stop state (FIG. 1 to FIG. 6 and FIG. 8 to FIG. 13).

Further, in the scanning circuit according to the preset invention, the threshold values of the thin film transistors constituting the pulldown circuit and the switching circuit shift in the same direction when an equivalent electric stress is applied to those thin film transistors during operation. (FIG. 3, FIG. 6, FIG. 10, FIG. 13, FIG. 16, and FIG. 19).

Further, in the scanning circuit according to the present invention, the electric stress applied to the transistor constituting the pulldown circuit is smaller than the electric stress applied to the transistor constituting the switching circuit (FIG. 3, FIG. 10, and FIG. 16).

Furthermore, in the scanning circuit according to the present invention, shift is generated in the threshold voltage of the thin film transistors constituting the pulldown circuit and the switching circuit due to the electric stress, and the shift amount of the threshold value of the thin film transistor constituting the pulldown circuit is smaller than the shift amount of the threshold value generated in the thin film transistor constituting the switching circuit (FIG. 3, FIG. 10, and FIG. 16).

Figure 13:
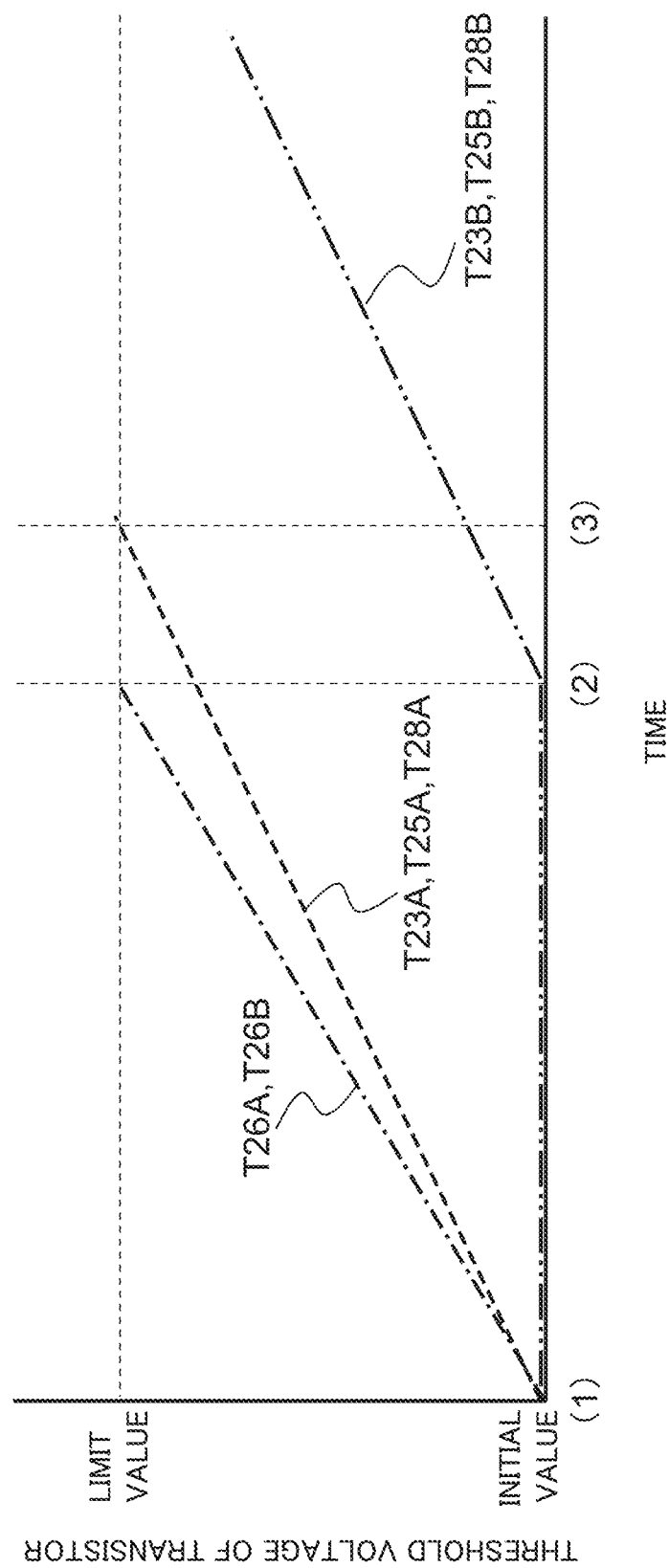
FIG. 13 is a timing chart showing changes generated over the time in the threshold voltage of the transistor that forms the unit circuit according to the second exemplary embodiment.
Figure 19:
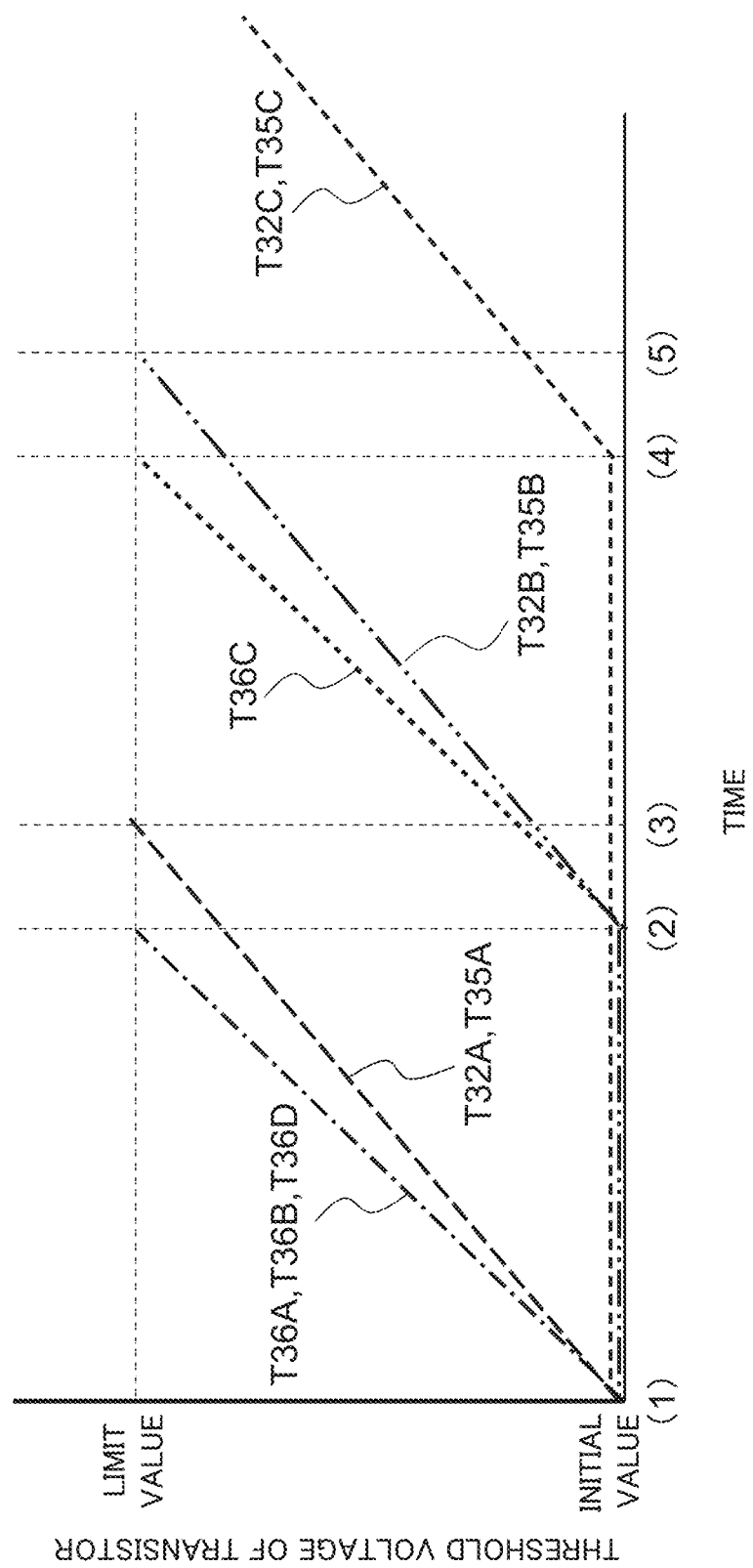
FIG. 19 is a timing chart showing changes generated over the time in the threshold voltage of the transistor that forms the unit circuit according to the third exemplary embodiment.
Figure 20:
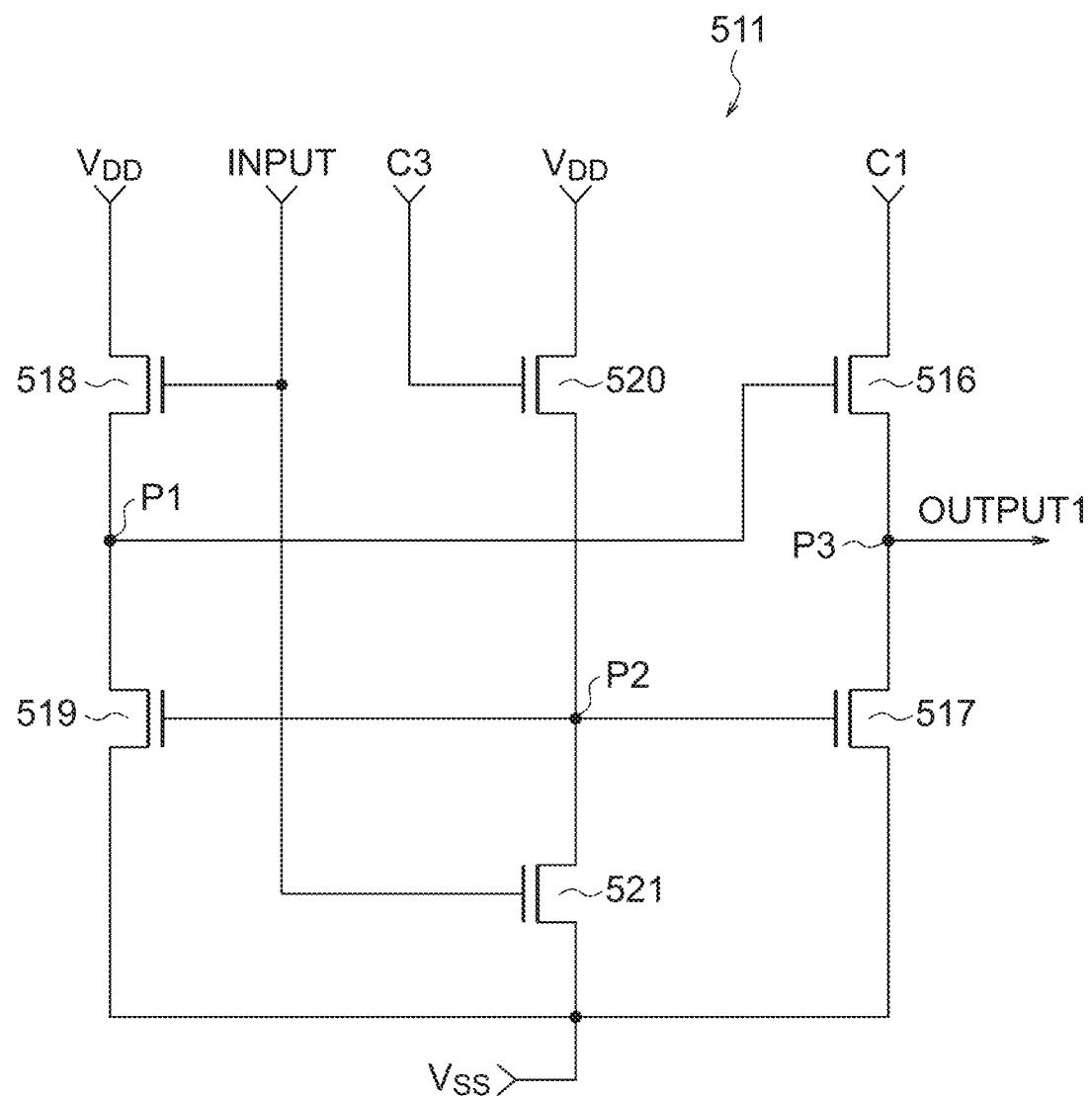
FIG. 20 is a circuit diagram showing the structure of Related Technique 1.
Figure 21:
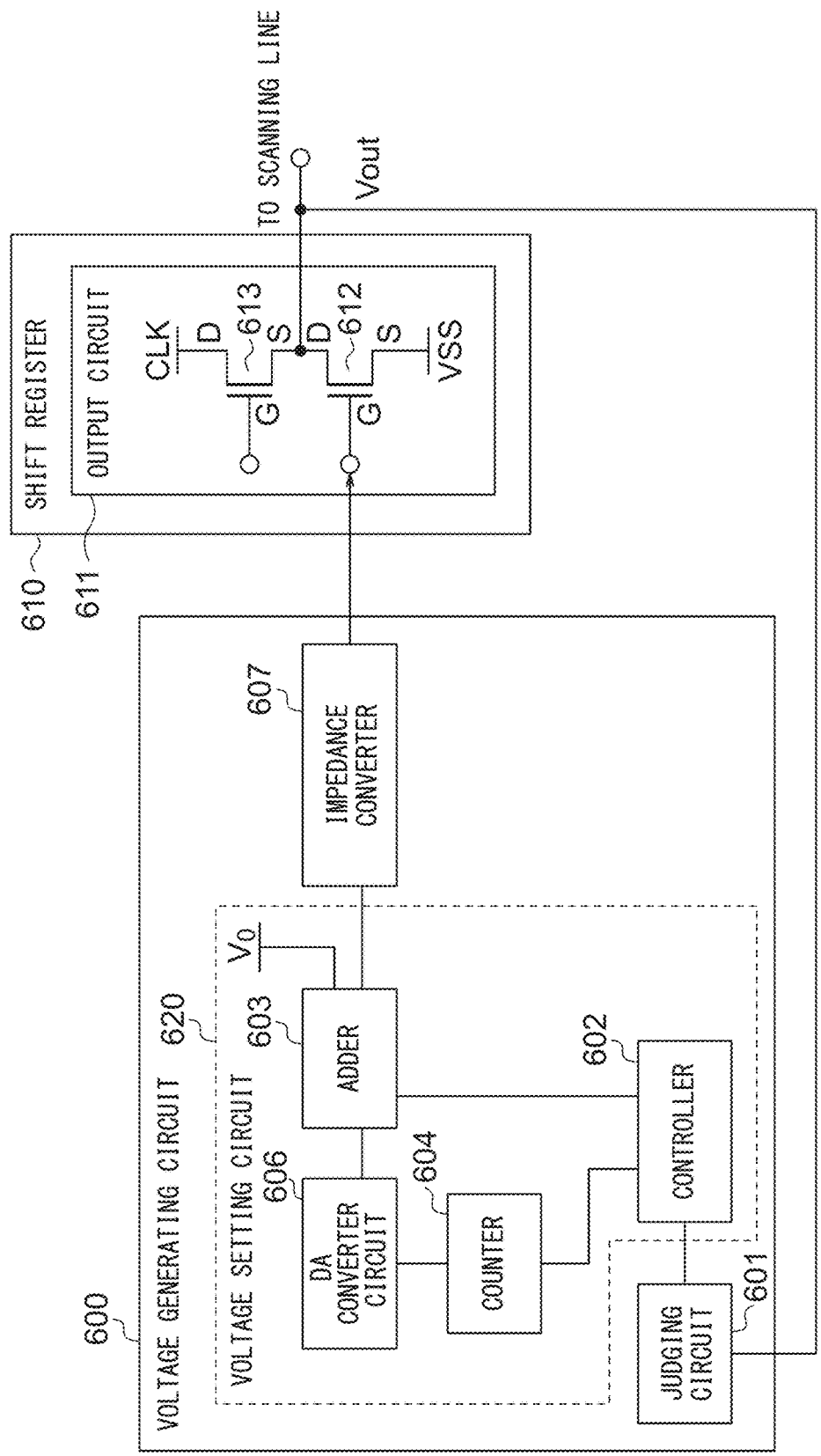
FIG. 21 is a block diagram showing the structure of Related Technique 2.
Figure 22:
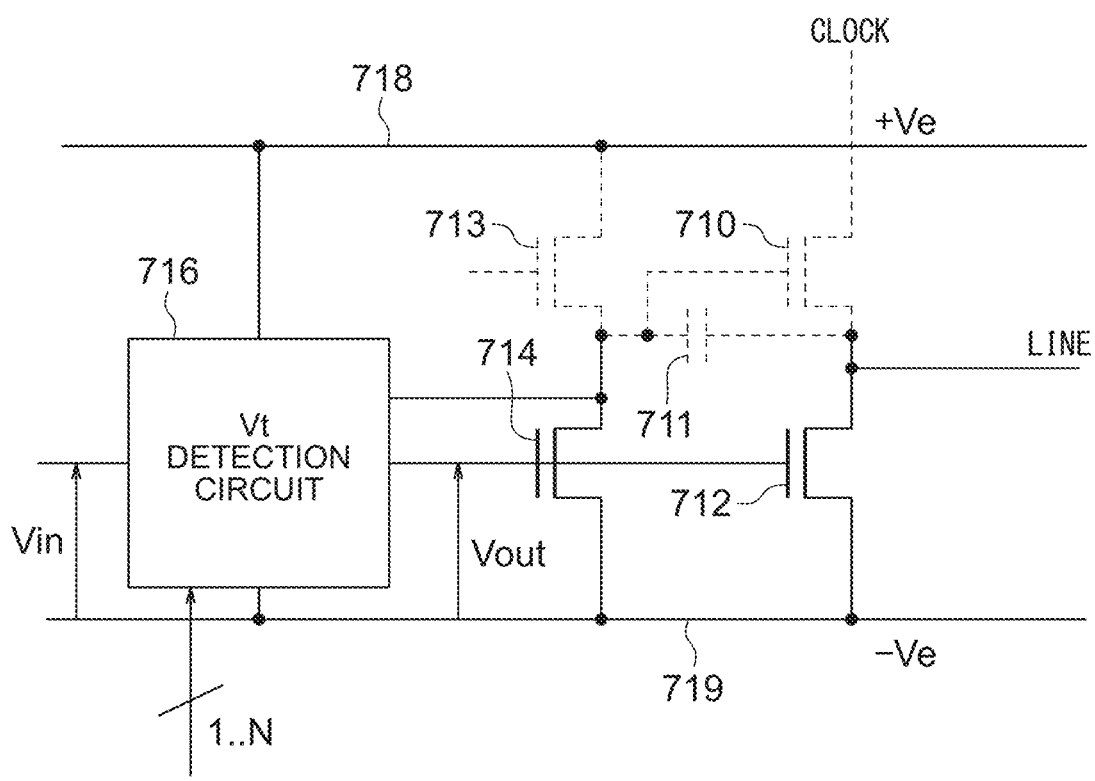
FIG. 22 is a circuit diagram showing the structure of Related Technique 3.

Further, in the scanning circuit according to the present invention, the switching circuit stops the operation earlier than the pulldown circuit in operation to switch another pulldown circuit to an operating state from an operation stop state (FIG. 6, FIG. 13, and FIG. 19).

Furthermore, in the scanning circuit according to the present invention, the unit circuit constituting the scanning circuit includes the first to N-th pulldown circuits and the first to (N−1)-th switching circuits. Provided that k is a natural number from 2 to (N−1), while the (k−1)-th pulldown circuit is in operation, the (k−1)-th switching circuit switches the k-th to N-th pulldown circuits and the k-th to (N−1)-th switching circuits to an operation stop state (FIG. 14 to FIG. 19).

The effect of the present invention is that it is possible to extend the operation life of the scanning circuit. The reasons thereof are as follows.

A plurality of pulldown circuits for setting the nodes within the unit circuit constituting the scanning circuit to be a specific voltage and a plurality of switching circuits for changing the pulldown circuits to an operating state from an operation stop state are provided. While a given pulldown circuit is in operation, another pulldown circuit is set to be in an operation stop state by the switching circuit. Even when the pulldown circuit comes to be in an operation stop state because of the property fluctuation of the thin film transistor constituting the pulldown circuit in operation, the switching circuit starts the operation of the pulldown circuit in an operation stop state. Therefore, the function of the pulldown circuits can be maintained continuously.

Next, Supplementary Notes regarding the present invention will be described. While a part of or a whole part of the above-described exemplary embodiments can be depicted as in following Supplementary Notes, it is to be noted that the present invention is not limited only to the following structures.

(Supplementary Note 1)

An electronic circuit formed with a plurality of transistors, which includes:

two or more switching-target circuits and one or more switching circuit which switches the switching-target circuits to an operating state from a stop state, wherein:

the two or more switching-target circuits include the switching-target circuit in the operating state and the switching-target circuit in the initial-to-stop state;

the transistors forming the switching-target circuits and the switching circuit have property fluctuation generated by an electric stress applied to the transistors; and the switching circuit switches the switching-target circuit in the initial-to-stop state to the operating state by the property fluctuation of the transistors of the switching circuit.

(Supplementary Note 2)

The electronic circuit as depicted in Supplementary Note 1, wherein the transistor of the switching circuit applies an off-voltage to a gate of the transistor of the switching-target circuit in the initial-to-stop state to maintain the switching-target circuit to the initial-to-stop state, and stops application of the off-voltage by the property fluctuation to switch the switching-target circuit in the initial-to-stop state to the operating state.

(Supplementary Note 3)

The electronic circuit as depicted in Supplementary Note 2, wherein the transistor of the switching circuit has the property fluctuation proceeded faster than the transistor of the switching-target circuit in the operating state since the electric stress is applied more, and stops application of the off-voltage before the switching-target circuit in the operating state comes to be in the stop state.

(Supplementary Note 4)

The electronic circuit as depicted in any one of Supplementary Notes 1 to 3, wherein:

the electric stress is applied voltage and applied time for a gate of the transistor; and the property fluctuation is shift of a threshold voltage.

(Supplementary Note 5)

A scanning circuit including a plurality of unit circuits each being formed with the electronic circuit of Supplementary Note 1, wherein:

the plurality of unit circuits are controlled by synchronizing with a clock signal;

the plurality of transistors are a plurality of single conductive type thin film transistors; and the two or more switching-target circuits are two or more potential setting circuits for setting nodes within the unit circuits to a specific potential, and include the potential setting circuit in an operating state and the potential setting circuit in an initial-to-stop state.

(Supplementary Note 6)

The scanning circuit as depicted in Supplementary Note 5, wherein the thin film transistor of the switching circuit applies an off-voltage to a gate of the thin film transistor of the potential setting circuit in the initial-to-stop state to maintain the potential setting circuit to the initial-to-stop state, and stops application of the off-voltage by the property fluctuation to switch the potential setting circuit in the initial-to-stop state to the operating state.

(Supplementary Note 7)

The scanning circuit as depicted in Supplementary Note 6, wherein:

the thin film transistor of the switching circuit has the property fluctuation proceeded faster than the thin film transistor of the potential setting circuit in the operating state since the electric stress is applied more; and stops application of the off-voltage before the potential setting circuit in the operating state comes to be in the stop state.

(Supplementary Note 8)

The scanning circuit as depicted in Supplementary Note 5, wherein:

the two or more potential setting circuits include two circuits that are a first potential setting circuit in the operating state and a second potential setting circuit in the initial-to-stop state;

the thin film transistor of the switching circuit applies an off-voltage to a gate of the thin film transistor of the second potential setting circuit to maintain the second potential setting circuit to the initial-to-stop state;

the thin film transistor of the switching circuit has the property fluctuation proceeded faster than the thin film transistor of the first potential setting circuit since the electric stress is applied more, and stops application of the off-voltage by the property fluctuation to switch the second potential setting circuit to the operating state before the first potential setting circuit in the operating state comes to be in the stop state.

(Supplementary Note 9)

The scanning circuit as depicted in Supplementary Note 5, wherein:

provided that N is an integer of 2 or larger, k is any one of integers from 1 to N−1;

the two or more potential setting circuits are constituted with first to N-th potential setting circuits, the k-th potential setting circuit is in the operating state, and the (k+1)-th to the N-th potential setting circuits are in the initial-to-stop state;

the one or more switching circuit is constituted with a first to (N−1)-th switching circuits;

the thin film transistor of the k-th switching circuit applies an off-voltage to a gate of the thin film transistor of the (k+1)-th potential setting circuit to maintain the (k+1)-th potential setting circuit to the initial-to-stop state;

the thin film transistor of the k-th switching circuit has the property fluctuation proceeded faster than the thin film transistor of the k-th potential setting circuit since the electric stress is applied more, and stops application of the off-voltage by the property fluctuation to switch the (k+1)-th potential setting circuit to an operating state before the k-th potential setting circuit in the operating state comes to be in the stop state.

(Supplementary Note 10)

The scanning circuit as depicted in any one of Supplementary Notes 5 to 9, wherein:

the electric stress is applied voltage and applied time for a gate of the transistor; and the property fluctuation is shift of a threshold voltage.

(Supplementary Note 11)

The scanning circuit as depicted in any one of Supplementary Notes 5 to 10, wherein:

the single conductive type is an N-channel type; and the potential setting circuits are pulldown circuits which set the node to a low potential.

(Supplementary Note 12)

A display device which includes the scanning circuit as depicted in any one of Supplementary Notes 5 to 11.

(Supplementary Note 13)

An electronic circuit life extending method used for an electronic circuit which is formed with a plurality of transistors and includes two or more switching-target circuits and one or more switching circuit which switches the switching-target circuits to an operating state from a stop state, wherein: the two or more switching-target circuits include the switching-target circuit in the operating state and the switching-target circuit in the initial-to-stop state; the transistors forming the switching-target circuits and the switching target have property fluctuation generated by an electric stress applied to the transistors, the method including:

switching the switching-target circuit in the initial-to-stop state to the operating state by the property fluctuation of the transistors of the switching circuit.

(Supplementary Note 14)

The electronic circuit life extending method as depicted in Supplementary Note 13, which includes:

applying an off-voltage to a gate of the transistor of the switching-target circuit in the initial-to-stop state by using the transistor of the switching circuit to maintain the switching-target circuit to the initial-to-stop state; and stopping application of the off-voltage by the property fluctuation of the transistors of the switching circuit to switch the switching-target circuit in the initial-to-stop state to the operating state.

(Supplementary Note 15)

The electronic circuit life extending method as depicted in Supplementary Note 14, which includes:

applying the electric stress more to the transistor of the switching circuit compared to the transistor of the switching-target circuit in the operating state to have the property fluctuation of the transistors of the switching circuit proceeded faster; and stopping application of the off-voltage before the switching-target circuit in the operating state comes to be in the stop state.

(Supplementary Note 16)

The electronic circuit life extending method as depicted in any one of Supplementary Notes 13 to 15, wherein:

the electric stress is applied voltage and applied time for a gate of the transistor; and the property fluctuation is shift of a threshold voltage.

INDUSTRIAL APPLICABILITY

Application examples of the present invention may be display devices such as liquid crystal display devices, organic EL displays, and the like.

What is claimed is:

1. An electronic circuit formed with a plurality of single conductive type thin film transistors, comprising:
two or more potential setting circuits for setting nodes within the electronic circuits to a specific potential and one or more switching circuit which switches the potential setting circuits to an operating state from a stop state,
wherein:
the two or more potential setting circuits include the potential setting circuit in the operating state and the potential setting circuit in the initial-to-stop state;
the thin film transistors forming the potential setting circuits and the switching circuit have property fluctuation generated by an electric stress applied to the thin film transistors; and
the switching circuit switches the potential setting circuit in the initial-to-stop state to the operating state by the property fluctuation of the thin film transistors of the switching circuit.

2. The electronic circuit as claimed in claim 1, wherein the thin film transistor of the switching circuit applies an off-voltage to a gate of the thin film transistor of the potential setting circuit in the initial-to-stop state to maintain the potential setting circuit to the initial-to-stop state, and stops application of the off-voltage by the property fluctuation to switch the potential setting circuit in the initial-to-stop state to the operating state.

3. The electronic circuit as claimed in claim 2, wherein the thin film transistor of the switching circuit has the property fluctuation proceeded faster than the thin film transistor of the potential setting circuit in the operating state since the electric stress is applied more, and stops application of the off-voltage before the potential setting circuit in the operating state comes to be in the stop state.

4. The electronic circuit as claimed in claim 2, wherein when the switching circuit switches the potential setting circuits to the operating state from the stop state, a capacity for performing potential setting is remained in the potential setting circuits already in the operating state.

5. The electronic circuit as claimed in claim 1, wherein:
the electric stress is applied voltage and applied time for a gate of the thin film transistor; and
the property fluctuation is shift of a threshold voltage.

6. A scanning circuit, comprising:
a plurality of unit circuits each being formed with the electronic circuit of claim 1,
wherein:
the plurality of unit circuits are controlled by synchronizing with a clock signal.

7. The scanning circuit as claimed in claim 6, wherein the thin film transistor of the switching circuit applies an off-voltage to a gate of the thin film transistor of the potential setting circuit in the initial-to-stop state to maintain the potential setting circuit to the initial-to-stop state, and stops application of the off-voltage by the property fluctuation to switch the potential setting circuit in the initial-to-stop state to the operating state.

8. The scanning circuit as claimed in claim 7, wherein:
the thin film transistor of the switching circuit has the property fluctuation proceeded faster than the thin film transistor of the potential setting circuit in the operating state since the electric stress is applied more; and
stops application of the off-voltage before the potential setting circuit in the operating state comes to be in the stop state.

9. The scanning circuit as claimed in claim 6, wherein:
the two or more potential setting circuits comprise two circuits that are a first potential setting circuit in the operating state and a second potential setting circuit in the initial-to-stop state;
the thin film transistor of the switching circuit applies an off-voltage to a gate of the thin film transistor of the second potential setting circuit to maintain the second potential setting circuit to the initial-to-stop state; and
the thin film transistor of the switching circuit has the property fluctuation proceeded faster than the thin film transistor of the first potential setting circuit since the electric stress is applied more, and stops application of the off-voltage by the property fluctuation to switch the second potential setting circuit to the operating state before the first potential setting circuit in the operating state comes to be in the stop state.

10. The scanning circuit as claimed in claim 6, wherein:
provided that N is an integer of 2 or larger, k is any one of integers from 1 to N−1;
the two or more potential setting circuits comprise first to N-th potential setting circuits, the k-th potential setting circuit is in the operating state, and the (k+1)-th to the N-th potential setting circuits are in the initial-to-stop state;
the one or more switching circuit comprises a first to (N−1)-th switching circuits;
the thin film transistor of the k-th switching circuit applies an off-voltage to a gate of the thin film transistor of the (k+1)-th potential setting circuit to maintain the (k+1)-th potential setting circuit to the initial-to-stop state; and
the thin film transistor of the k-th switching circuit has the property fluctuation proceeded faster than the thin film transistor of the k-th potential setting circuit since the electric stress is applied more, and stops application of the off-voltage by the property fluctuation to switch the (k+1)-th potential setting circuit to an operating state before the k-th potential setting circuit in the operating state comes to be in the stop state.

11. The scanning circuit as claimed in claim 6, wherein:
the electric stress is applied voltage and applied time for a gate of the transistor; and
the property fluctuation is shift of a threshold voltage.

12. The scanning circuit as claimed in claim 6, wherein:
the single conductive type is an N-channel type; and
the potential setting circuits are pulldown circuits which set the node to a low potential.

13. A display device, comprising the scanning circuit as claimed in claim 6.

14. An electronic circuit life extending method used for an electronic circuit which is formed with a plurality of single conductive type thin film transistors and comprises two or more potential setting circuits for setting nodes within the electronic circuits to a specific potential and one or more switching circuit which switches the potential setting circuits to an operating state from a stop state, wherein:

the two or more potential setting circuits include the potential setting circuit in the operating state and the potential setting circuit in the initial-to-stop state;

the thin film transistors forming the potential setting circuits and the switching circuit have property fluctuation generated by an electric stress applied to the thin film transistors, the method comprising:

switching the potential setting circuit in the initial-to-stop state to the operating state by the property fluctuation of the thin film transistors of the switching circuit.

15. The electronic circuit life extending method as claimed in claim 14, comprising:

applying an off-voltage to a gate of the thin film transistor of the potential setting circuit in the initial-to-stop state by using the thin film transistor of the switching circuit to maintain the potential setting circuit to the initial-to-stop state; and stopping application of the off-voltage by the property fluctuation of the thin film transistors of the switching circuit to switch the potential setting circuit in the initial-to-stop state to the operating state.

16. The electronic circuit life extending method as claimed in claim 15, comprising:

applying the electric stress more to the thin film transistor of the switching circuit compared to the thin film transistor of the potential setting circuit in the operating state to have the property fluctuation of the thin film transistors of the switching circuit proceeded faster; and stopping application of the off-voltage before the potential setting circuit in the operating state comes to be in the stop state.

17. The electronic circuit life extending method as claimed in claim 14, wherein:

the electric stress is applied voltage and applied time for a gate of the thin film transistor; and the property fluctuation is shift of a threshold voltage.

* * * * *